(12) United States Patent
Takano et al.

(10) Patent No.: US 6,842,377 B2
(45) Date of Patent: Jan. 11, 2005

(54) NONVOLATILE SEMICONDUCTOR MEMORY DEVICE WITH FIRST AND SECOND READ MODES

(75) Inventors: Yoshinori Takano, Tokyo (JP); Yasuhiko Honda, Yokohama (JP); Toru Tanzawa, Tokyo (JP); Masao Kuriyama, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/412,646

(22) Filed: Apr. 11, 2003

(65) Prior Publication Data

US 2003/0214861 A1 Nov. 20, 2003

(30) Foreign Application Priority Data

Apr. 12, 2002 (JP) .......................................... 2002-111117

(51) Int. Cl.[7] .............................................. G11C 16/06
(52) U.S. Cl. ............................... 365/185.21; 365/185.33
(58) Field of Search .................................. 365/205, 207, 365/208, 185.03, 185.2, 185.21, 185.33

(56) References Cited

U.S. PATENT DOCUMENTS

| | | | | | |
|---|---|---|---|---|---|
| 5,293,332 A | * | 3/1994 | Shirai | ..................... | 365/189.02 |
| 5,751,657 A | * | 5/1998 | Hotta | ..................... | 365/238.5 |
| 6,061,297 A | | 5/2000 | Suzuki | ..................... | 365/238.5 |
| 6,216,180 B1 | * | 4/2001 | Kendall et al. | ............... | 710/35 |
| 6,477,101 B2 | * | 11/2002 | Cavaleri et al. | ............ | 365/221 |
| 6,671,203 B2 | * | 12/2003 | Tanzawa et al. | ....... | 365/185.11 |
| 2001/0048178 A1 | | 12/2001 | Suzuki | ..................... | 365/238.5 |
| 2002/0186593 A1 | | 12/2002 | Takano et al. | ......... | 365/185.21 |
| 2003/0235093 A1 | * | 12/2003 | Kawano | ..................... | 365/200 |

FOREIGN PATENT DOCUMENTS

JP  08-045283  2/1998  ........... G11C/16/06

* cited by examiner

Primary Examiner—Son Mai
(74) Attorney, Agent, or Firm—Hogan & Hartson, LLP

(57) ABSTRACT

A nonvolatile semiconductor memory device with a plurality of read modes switchably built therein is provided. This nonvolatile semiconductor memory device is the one that has a memory cell array in which electrically rewritable nonvolatile memory cells are laid out and a read circuit which performs data readout of the memory cell array. The nonvolatile semiconductor memory device has a first read mode and a second read mode. The first read mode is for reading data by means of parallel data transfer of the same bit number when sending data from the memory cell array through the read circuit up to more than one external terminal. The second read mode is for performing parallel data transfer of a greater bit number than that of the first read mode when sending data from the memory cell array to the read circuit while performing data transfer of a smaller bit number than the bit number when sending data from the read circuit up to the external terminal.

13 Claims, 35 Drawing Sheets

NONVOLATILE SEMICONDUCTOR MEMORY DEVICE WITH FIRST AND SECOND READ MODES

CROSS-REFERENCE TO PRIOR APPLICATION

This application is based upon and claims the benefit of priority from the prior Japanese Patent Application No. 2002-111117. filed on Apr. 12, 2002, the entire contents of which are incorporated herein by reference.

BACKGROUND OF THE INVENTION

1. Field of the Invention

This invention relates to electrically rewritable nonvolatile semiconductor memory devices including, but not limited to, electrically erasable programmable read-only memories (EEPROMs).

2. Description of the Related Art

In recent years, flash EEPROM memories include advanced chips with multiple built-in operation modes, such as a page mode and a burst mode. The page mode and burst mode are for enabling achievement of high-speed read operations by reading data out of a memory cell array to a page buffer in units of pages—a page consists of a plurality of words of data—and then storing therein the read data, and for performing data transmission in a pathway spanning from a read circuit up to more than one external terminal by intra-page random access architectures (in the case of the page mode) or alternatively as a series of burst signals in a fixed, clock-controlled order (in the burst mode).

In an ordinary or standard random access-based word mode, data readout is done on a per-word bases for the part covering from the memory cell array through the read circuit up to the external terminal(s), wherein a word consists of a prespecified number of bits of binary data—for example, eight (8) or sixteen (16) or else. In this case, a time as taken to perform cell selection, date sensing and data output may be approximately 100 nanoseconds (ns). This read time period determines the length of an access cycle. In contract, in the case of the page mode, letting a page of data be read into a page buffer in advance makes it possible to perform high-speed random access operations thereafter by intra-page accessing within a shortened length of read time period, which measures about 25 ns.

To make a flash memory offer the operating capability in such page mode, an increased number of on-chip sense amplifiers should be employed. For example, if one page is 8 words (i.e. 128 bits) of data, then sense amps which correspond in number to 8 words are required. However, if the flash memory is specifically designed to have page-mode functionality only, then problems occur in cases where a system with such page mode-dedicated flash memory built therein does not support the page mode in any way. Supposing that the flash memory chip is operable in the page mode although the system fails to offer page-mode operability, a great number of sense amps must operate in vain. And, when all of the sense amps corresponding in number to 8 words (i.e. 1 page) operate together in spite of the fact that what is required is merely to operate a sense amp corresponding to one word, this results in significant waste of electrical power being consumed.

It is an object of this invention to provide a new and improved nonvolatile semiconductor memory device with a plurality of read modes switchably built therein.

SUMMARY OF THE INVENTION

A nonvolatile semiconductor memory device in accordance with this invention includes a memory cell array with an array of electrically rewritable nonvolatile memory cells, and a read circuit for performing data readout of the memory cell array, wherein the device has a first read mode for reading data while performing parallel data transfer of an identical bit number when sending data from the memory cell array through the read circuit to more than one external terminal and a second read mode for performing parallel data transfer of a greater bit number than that of the first read mode when sending data from the memory cell array to the read circuit and for performing data transfer of a smaller bit number than the bit number when sending data from the read circuit to the external terminal.

DETAILED DESCRIPTION OF THE EMBODIMENTS

Embodiments of this invention will be explained with reference to the accompanying drawings below.

Figure 1:
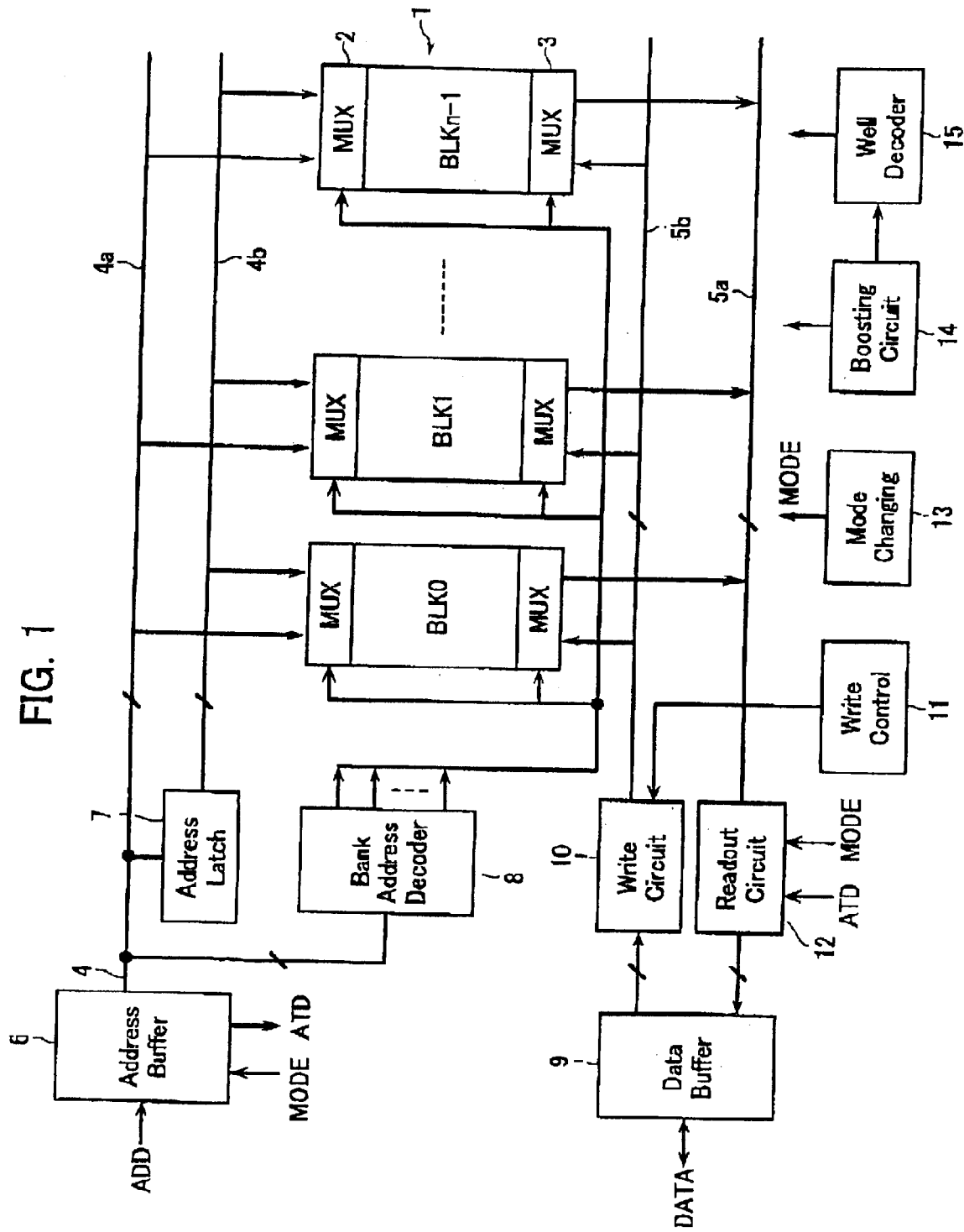
FIG. 1 is a diagram showing a configuration or a flash memory in accordance with an embodiment of this invention.

FIG. 1 illustrates, in schematic circuit block form, a configuration of a flash EEPROM chip in accordance with one embodiment of the invention. Shown herein is a flash memory capable of simultaneous execution of both a data rewrite operation in a given bank and a data read operation in another bank.

A memory cell array 1 is arranged by disposing nonvolatile memory cells in a way as will be described later. The cell array 1 is constituted from n cell blocks BLK (BLK0, BLK1, . . . , BLKn-1), which are subdivided into two or more banks each having an appropriate number of cell blocks. In order to enable simultaneous execution of data rewriting and data reading in different banks, address signal lines 4 are divided into a bundle of read-use address signal lines 4a and a bundle of write-use address signal lines 4b. Similarly, data lines 5 also are divided into a bundle of read-use data lines 5a and a bundle of write-use data lines 5b.

An external address signal ADD is sent to and accepted or accommodated by an address buffer 6. The address signal ADD involves an intra-bank address, which is transferred to a read address signal line 4a during data reading. During writing, this intrabank address is once held at an address latch 7 and is then sent forth toward a write address signal line 4b. The address latch 7 is prepared for retaining therein a write address during a write operation.

The address signal ADD also includes a bank address, to which an upper-level address is normally assigned. This bank address is decoded by a bank address decoder 8, causing a bank being presently selected by its output to be activated. More specifically, multiplexers 2, 3 which are provided per each cell block are controlled by an output of the bank address decoder 8 so that each cell block is selectively connected to either one of the address signal lines 4a and 4b or alternatively to one of the data lines 5a–5b.

The read data line 5a and write data line 5b are connected to a data buffer 9 through a write circuit 10 and a read circuit 12, respectively. The write circuit 10 is controlled by a write control circuit 11 to permit execution of data writing in a given bank. A data rewrite or "reprogramming" operation includes a data erase operation on a per-erase unit basis and a data write operation plus a verify-read operation for write verification purposes.

A boosting circuit 14 is provided to generate a high voltage used for write and erase. An output of the boosting circuit 14 is supplied to a word line(s) of the cell array 1 and is also decoded by a well decoder 15 to thereby permit generation of a voltage to be given to a semiconductive well layer of a data-rewritten cell region.

Figure 2:
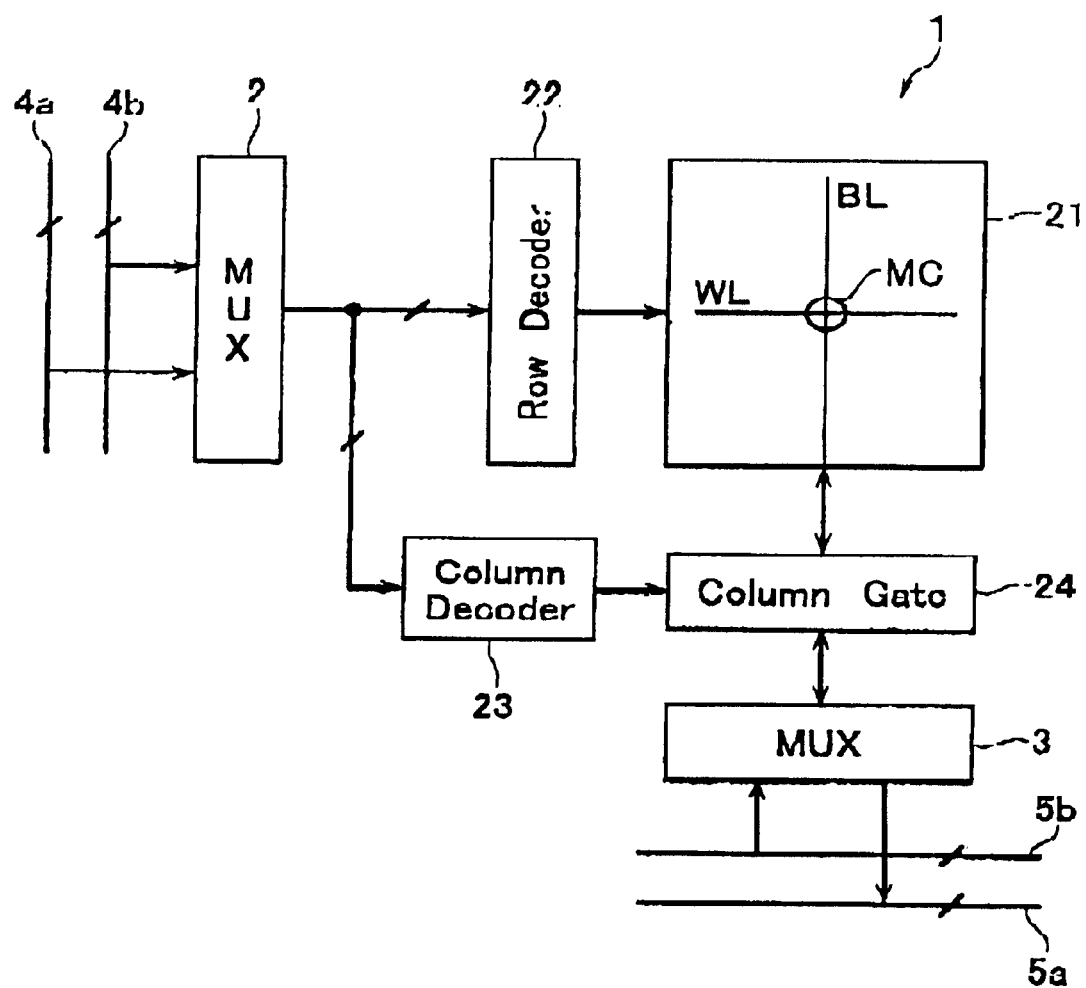
FIG. 2 it a diagram showing an arrangement of a cell block within a cell array of the embodiment.
Figure 3:
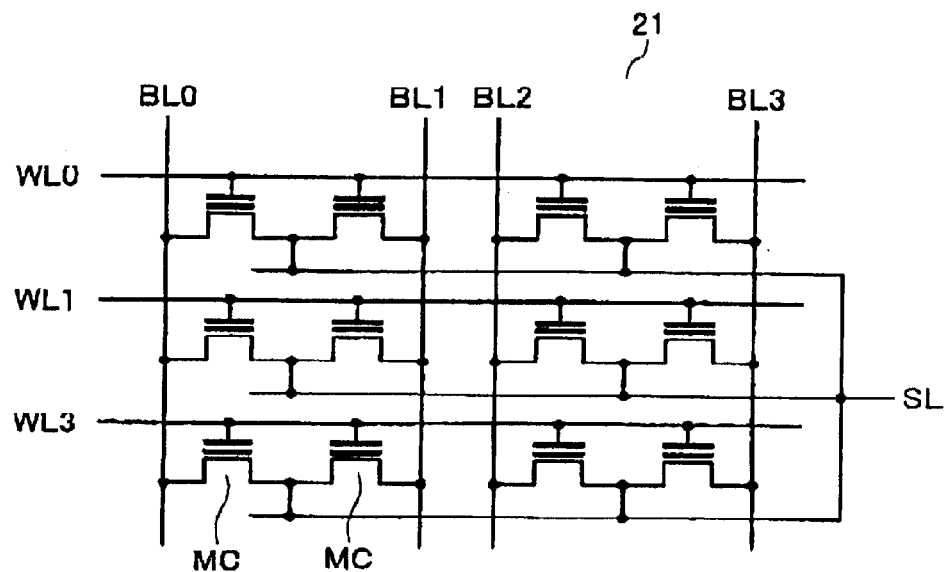
FIG. 3 is a diagram showing a cell array configuration of the embodiment.

As shown in FIGS. 2 and 3, each cell block of the memory cell array 1 is arranged so that a plurality of parallel word lines WL and multiple parallel bit lines BL cross together to define cross-points or intersections, at each of which a memory cell MC is disposed to thereby provide the so-called NOR type configuration. A row decoder 22 is provided for selection among the word lines of the memory cell array 1. For bit-line selection, a column decoder 23 and a column gate 24 which is selectively activated thereby are provided.

Figure 4:
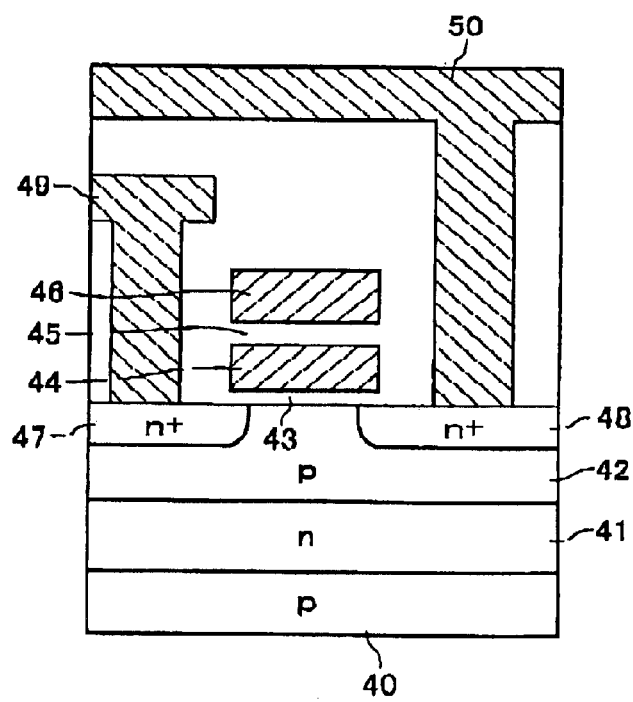
FIG. 4 is a diagram showing a memory cell structure of the embodiment.

FIG. 4 shows the structure of a memory cell MC. This memory cell MC is a nonvolatile memory cell which has a metal insulator semiconductor field effect transistor (MISFET) structure with a floating gate 44 for use as a charge accumulation layer and a control gate 46 stacked over the floating gate 44. A silicon substrate 40 has a semiconductive well region 41 of n type conductivity as formed therein. A well region of p type conductivity is formed within the n-type well 41. In this p-type well 42, a memory cell MC is formed.

The memory cell MC it arranged so that its floating gate 44 is formed above the p-type well 42 with a gate dielectric film 43 interposed therebetween. The floating gate 44 may be a polycrystalline silicon or "poly-Si" film. Memory cell MC also has its control gate 46, which is formed above the floating gate 44 with an electrically insulative dielectric film 45 sandwiched between them. The control gate 46 may be a poly-Si film. Furthermore, diffusion layers 47, 48 for use as the source and drain are formed in p-well 42 so that these source/drain diffusions 47–48 are self-aligned with the control gate 46. Control gate 46 is continuously formed in one direction of a cell matrix so that it becomes a word line WL. Drain diffusion layer 48 is connected to a bit line 50; source diffusion layer 47 is coupled to a source line 49.

The p-well 42 is independently formed in every part to be subjected to simultaneous data erasing, also known as "all-at-a-time" or "all-at-once" erase. This part will be referred to as "erase block" hereinafter. FIG. 3 depicts a portion of a cell array within a single erase block, wherein parallel word lines WL and bit lines BL continuously extend so that these intersect together within the erase block, with sources of all intra-block memory cells being commonly connected together to a source line SL.

An operation of the memory cells MC is as follows. During data writing, apply a write voltage with a potential of about 10 volts (V) to a presently selected word line WL while setting the p-well 42 and source line (SL) 49 at 0V. Apply to a bit line BL a voltage of 6V or 0V in accordance with a data bit of either logic "0" or "1." At a memory cell to which "0" data is given, hot electrons are produced by the presence of a strong lateral-directional electric field between the cell's drain and source and then injected onto its floating gate 44. In the case of "1" data, no such electron injection occurs.

The resulting state with a threshold voltage made higher due to the electron injection onto the floating gate is a "0" data storage state. In the case of "1" data, no hot electrons are produced. Thus, no electrons are injected to the floating gate. This results in retention of an erase state, that is, "1" data state low in threshold voltage.

Data erasing is performed so that all the memory cells are erased at a time on a per-erase block basis. In this per-block all-at-once erase session, apply a voltage of about 10V to the n-type well 41 and also to the p-well 42 and source line SL of a presently selected block. In addition, apply a voltage of about –7V to all the word lines WL within such selected erase block. Whereby, a relatively large electric field is applied to the gate insulator film 43 of the memory cells within the erase block causing electrons residing on the floating gate of each cell to release by Fowler-Noldheim (FN) current (tunnel current), resulting in establishment of a data "1" erase state.

Data readout is done in a way which follows. Apply a read voltage to a selected word line. The read voltage is potentially midway between the threshold voltages of data "0" and "1." Then, let a sense amplifier connected to a bit line determine or "judge" whether the current pull-in of a memory cell is present or absent.

The flash memory of this embodiment is capable of switching between two different read modes—namely, a word mode and a page mode (or burst mode)—in a way responsive to receipt of either an externally incoming mode change signal or an appropriate internal signal. Shown in FIG. 1 is a practically implemented example with a built-in mode changing circuit 13 for generation of a mode change signal MODE. With the use of this mode change signal MODE, the read circuit 10 and address buffer 6 are switching-controlled in a way as will be explained in detail later in the description.

In the word mode, parallel data is read, per word (e.g. 16 bits), out of the memory cell array 1 through the read circuit 12 and also via the data buffer 9 toward external terminals. In the page mode, parallel data is read out of the cell array 1 into the read circuit 12 on a per-page basis (e.g. 8 words) and then latched in an appropriate page buffer. And, the read circuit 12 is random-accessed by an intra-page address or addresses, allowing data to be read to the external terminals in units of words.

[Mode Changing Circuit]

Figure 5:
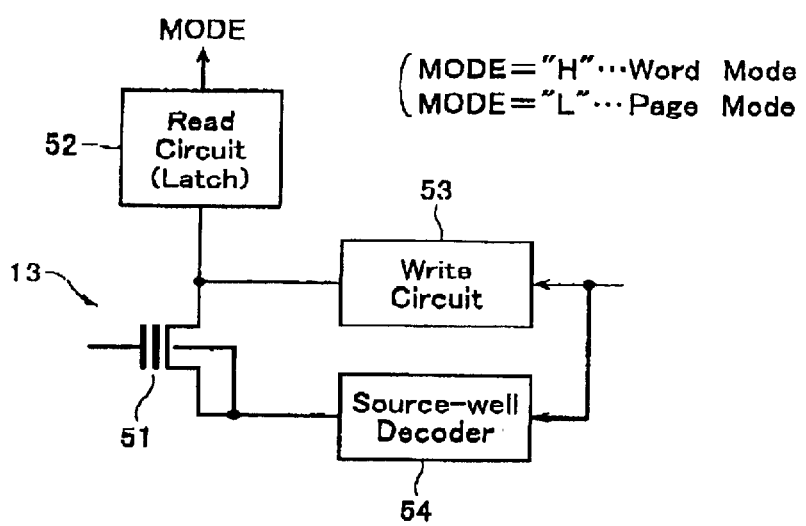
FIG. 5 is a diagram showing a configuration of a mode changer circuit of the embodiment.

FIG. 5 shown one exemplary configuration of the mode changing circuit 13. This mode changing circuit 13 has a mode-dedication memory cell 51, which is formed within a chip by use of the same process as the memory cells. A write circuit 53 and a source well decoder 54 are provided for enabling this memory cell 51 to be rewritten or "reprogrammed" under the control of a chip outside signal in a similar way to that of the write circuit module operatively associated with the cell array 1. Information of this memory cell 51 is written prior to product shipment, by way of example. And, appropriate design is made causing the cell information to be read into the read circuit 52 and latched therein upon power-up. With such an arrangement, the chip's read mode is determined so that this chip is set in a word mode when MODE="H" and in a read mode when MODE="L."

[Address Buffer]

Figure 6:
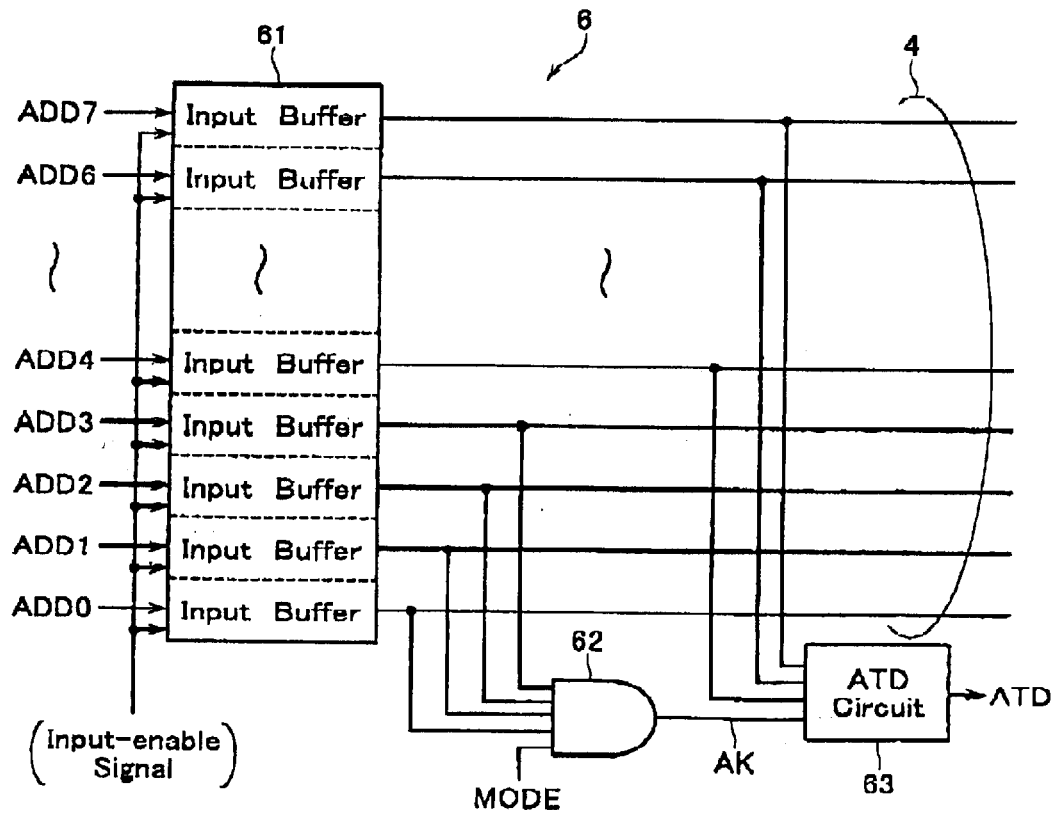
FIG. 6 is a diagram showing an arrangement of an address buffer of the embodiment.

FIG. 6 shows an arrangement of the address buffer 6. Address buffer 6 has a group of input buffers 61 for receipt of the inputs of external address terminals, and an address transition detecting (ATD) circuit 63 which detects a level transition of each output signal line 4 of this input buffer group 61 and then generates a trigger pulse (ATD pulse). Input buffer group 61 is made active by an input enable signal (same as a chip enable signal) to accept and accommodate the address signal ADD into the chip inside. ATD circuit 63 functions as a reference signal source which generates a timing signal(s) of internal circuitry including sense amplifiers or else.

The address buffer 6 of FIG. 6 is arranged to provide coexistence or compatibility of both a page mode and a word mode. If the chip of interest is a word mode-dedicated product, then the ATD circuit 63 performs pulse generation in response to a change in outputs of all the input buffers. Alternatively, if it is a page mode-dedicated product then ATD circuit 63 is allowed to detect only a change or switching in the output of an upper-level address input buffer(s). In this case, this circuit is no longer required to generate any ATD pulses in response to changes in a lower-level address(es). This can be said because in the page mode, any data read operation from the cell array is not performed at the timing synchronized with a low-level address change or transition.

Consequently in this embodiment, an AND gate 62 is provided in order to perform changeover or switching between the word mode and page mode. The AND gate 62 receives a low-level address signal(s) and a mode change signal MODE as input thereto. Its output is supplied to the ATD circuit 63. With such an arrangement. ATD circuit 63 is operable to detect any possible changes of the outputs of all the address input buffers 61 in the word mode when MODE="H"; alternatively, in the page mode of MODE="L," ATD circuit 63 detects the upper-level address(es) only.

Figure 7:
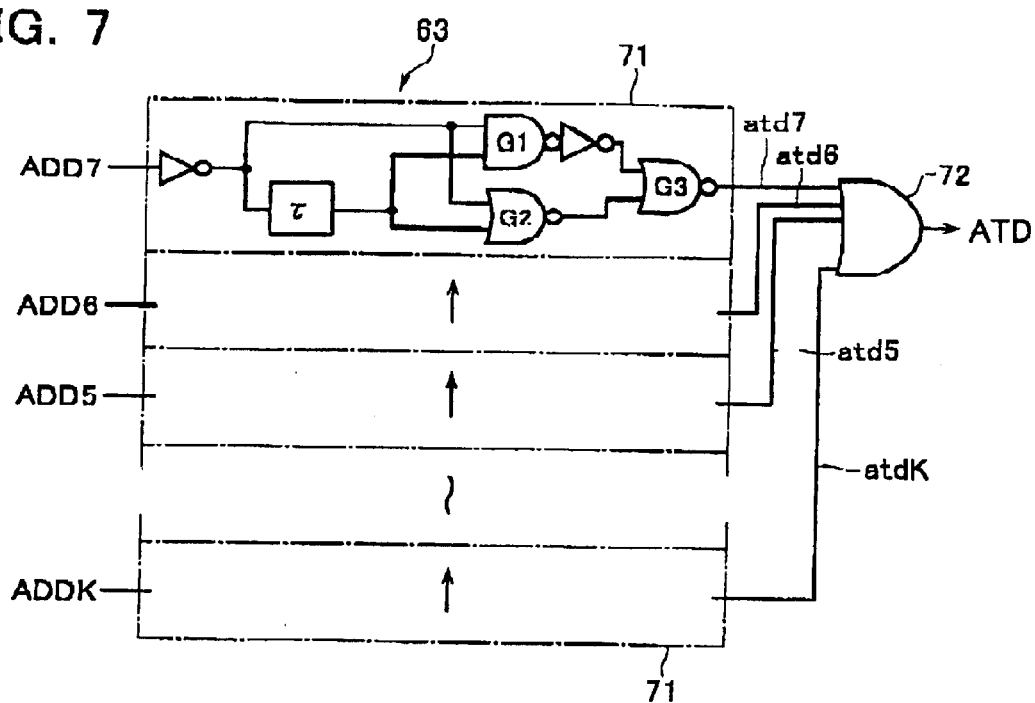
FIG. 7 is a diagram showing a configuration of an address transition detection circuit in the address buffer.
Figure 8:
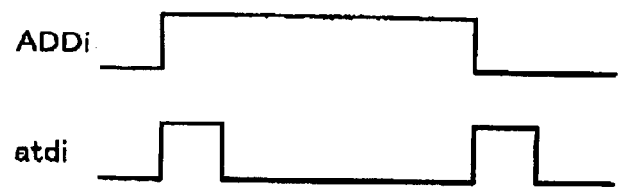
FIG. 8 is a diagram for explanation of an operation of the address transition detector circuit.
Figure 9:
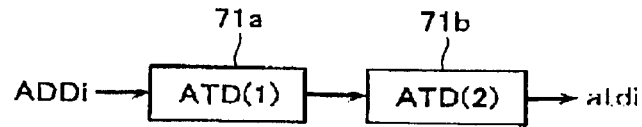
FIG. 9 is a diagram showing another configuration example of the address transition detector circuit.

FIG. 7 shows a configuration example of the ATD circuit 63. ATD circuit 63 is generally made up of a parallel combination of pulse generation circuits 71 corresponding in number to the input buffers being subjected to address transition detection, and an OR gate 72 operable to digitally calculate a logical sum of the outputs of them. As shown in FIG. 8, the pulse generator circuit 71 may be a known edge detection circuit for detection of both pulse edges—i.e. rising and falling edges—of an address signal ADD1, which circuit generates secondary or "child" pulse. atd1 as shown in FIG. 8. Performing logical OR processing of these child pulses results in generation of the ATD pulses to be used by the chip.

in order to obtain ATD pulses of good quality, the pulse generator circuit 71 may be designed so that two stages (or more than three stages) of pulse generator circuits 71a, 71b are arrayed in series as shown in FIG. 9. This is recommendable to avoid the risk which follows: in cases where address signals are switched at high speeds, mere use of a single stage of pulse generator circuit would result in incapability to obtain any sufficient operation responsibility, resulting in lack of an ability to obtain ATD pulses with the required width. As the first stage of pulse generator circuit 71a generates child pulses at the both edges of an address signal ADDi, the second stage of pulse generator circuit 71b may be configured as an edge detector circuit for detecting rising pulses only.

[Read Circuit]

Figure 10:
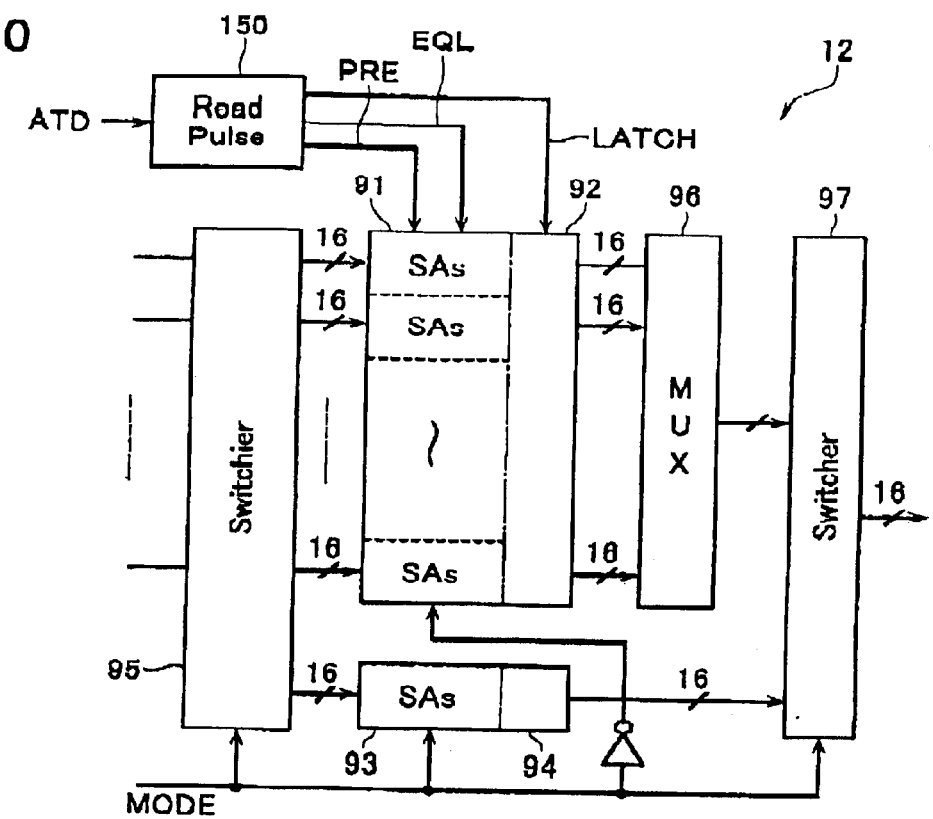
FIG. 10 is a diagram showing a configuration of a read circuit of the embodiment.

FIG. 10 shows an exemplary configuration of the read circuit 12. In this embodiment, it has built-in page and word modes. Accordingly, an array of sense amplifiers 91 and another array of sense amplifiers 93 are provided in parallel: the sense amp array 91 is for sensing a page of data (1 page is 8 words equal to 128 bits) in the page mode; the sense amp array 93 is for sensing a word of data in the word mode. These sense amp arrays 91, 93 are provided with data latch circuits 92, 94, respectively, each of which stores and latches sensed data therein. Data latch 92 makes up a page buffer which retains a page of sense data.

The read circuit 12 also has a read pulse generation circuit 150, which is operatively responsive to receipt of an ATD pulse as generated from the ATD circuit 63, for generating signals used for timing-control of the sense amp arrays 91, 93 and data latches 92, 94, such as a pre-charge signal PRE, equalization signal EQL, and latch signal LATCH.

Data lines as input to the sense amp arrays 91, 93 are provided with a signal transfer path switching circuit 95 which is responsive to receipt of a mode change signal MODE for switching between separate signal transmission pathways, one of which is for transferring eight words or data toward the sense amp array 91 in a page mode, and the other of which is for sending a word of data to the sense amp array 93 in a word mode. This switching circuit 95's transfer pathway toward the sense amp array 93 side is equipped with a decoding function for selection of a word of data at low-level addresses A0–A3.

On the output side of the sense amp arrays 91, 93 also, a switcher circuit 97 is provided which is controlled by the mode change signal MODE to determine which one of the outputs of the page-mode sense amp array 91 and the word-mode sense amp array 93 is to be selected. A multiplexer 96 is provided on the output aide of sense amp array 91, for performing data readout on a per-word basis in the page mode, although this function may alternatively be achieved by the switch circuit 97 per se if designed to offer double functioning capabilities.

The sense amp arrays 91, 93 are controlled by the mode change signal MODE so that only either one of them is selectively activated. More specifically, in the word mode with MODE="H," the sense amp array 93 is made active and the sense amp array 91 is made inactive. In the page mode with MODE="L," the sense amp array 93 is activated while sense amp array 91 is inactivated.

With such sense-amp control architecture, any waste electrical power is no longer consumed, otherwise occurring due to operations of those sense amps corresponding in number to a page of data in the case or the word mode.

Figure 11:
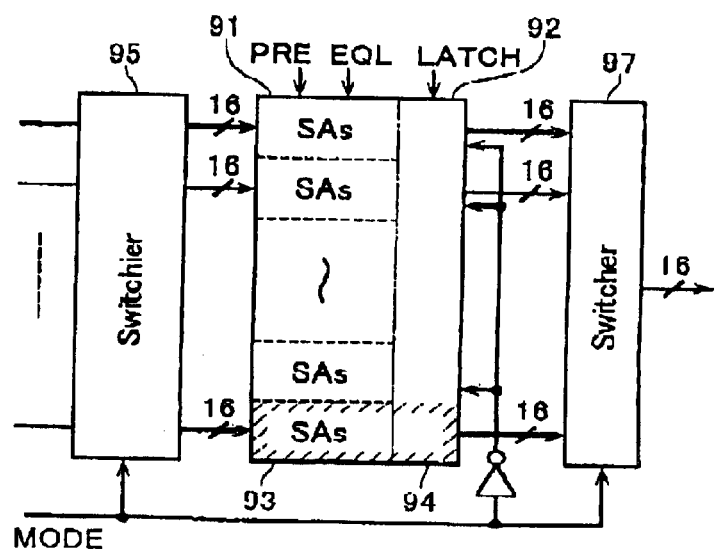
FIG. 11 is a diagram showing another configuration of the read circuit of the embodiment.

FIG. 11 is another exemplary configuration of the read circuit 12, in this example, only the sense amp array 91 corresponding in number to a page is used. Let this sense amp array 91 be subdivided into a sense amp group corresponding in number to seven words of data and a sense amp group 93 corresponding to a word of data: the former is activated in the page mode only; the latter is activated both in the page mode and in the word mode. The mode change signal MODE is input to the sense amp group with limited operability in the page mode only. In the word mode, inactivate them together. Let the sense amp group 93 of one word stay active constantly in any events.

To achieve page-mode operating capability also, a data-line switching circuit 95 is provided for the data lines inputting to the sense amp array 91. It is the same as the case of FIG. 10 that the data-line switcher circuit 95 is for narrowing down from eight-word data lines to certain data lines corresponding in number to a word of data—say, one-word data lines—in the word mode, and that this switcher circuit 95 has decode functionality with low-level address information. Note however that the destination of data narrow-down by the switcher circuit 95 is the sense amp group 93 that is part within the sense amp array 91. Similarly a switcher circuit 97 is provided at the output of sense amp array 91 also. This switcher circuit 97 performs switching between outputs in page and word modes in responding to the mode change signal MODE. The switcher circuit 97 also has multiplexer functionality for use in the page mode.

Figure 12A:
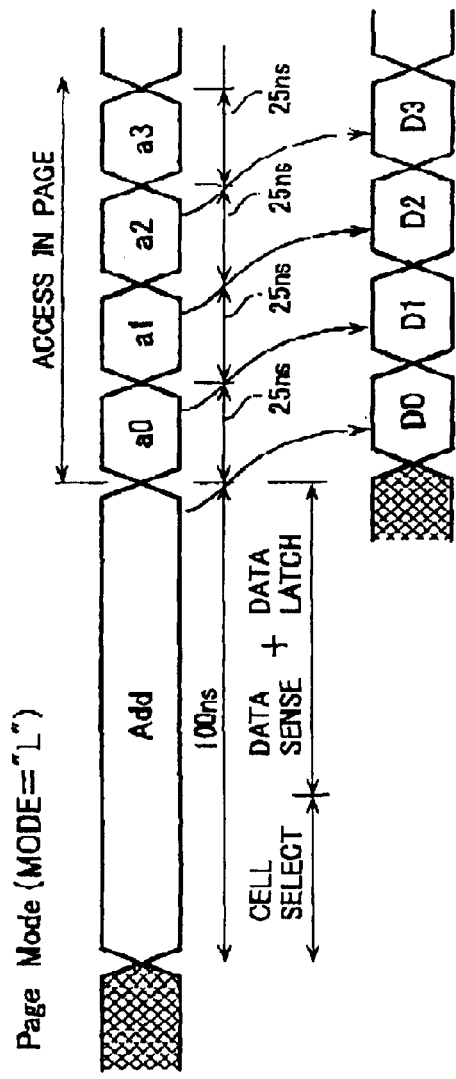
FIGS. 12A and 12B are timing diagrams for explanation of two read modes of the embodiment.
Figure 12B:
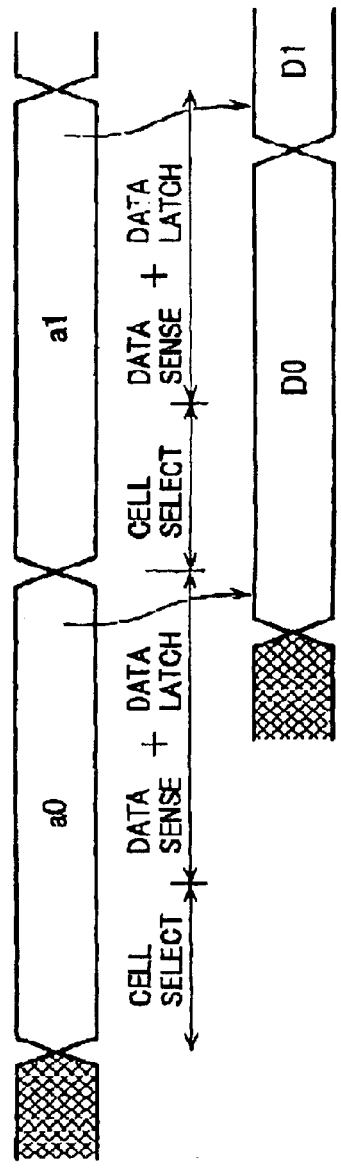

FIGS. 12A and 12B show operation timings of the flesh memory in accordance with this embodiment in a page mode and a word mode, respectively. As previously stated, either one of these page and word modes is set by a mode change signal MODE. In the page mode (MODE="L"), selection of a page of cells and cell data sensing plus latching are performed within a time period of about 100 nanoseconds (ns). Data as held in the page buffer is randomly read by intra-page access on a per-word basis. A time taken to read data from this page buffer is about 25 ns. In the word mode (MODE="H"), a series of operations covering from per-word cell selection through data sense and latching up to outputting the external terminals will be repeated in a cycle of about 100 ns.

As apparent from the foregoing discussion, according to this embodiment, it is possible to permit the same chip to offer operability in any one of the word and page modes. Although sense amplifiers corresponding in number to a page of data are provided, any waste electrical power will hardly be consumed by forcing those sense amps of no use to stay inactive in the case of setting in the word mode.

An explanation will next be given of a detailed configuration of respective constituent components of the flash memory in accordance with this embodiment.

[Sense Amplifier Circuit]

Figure 13:
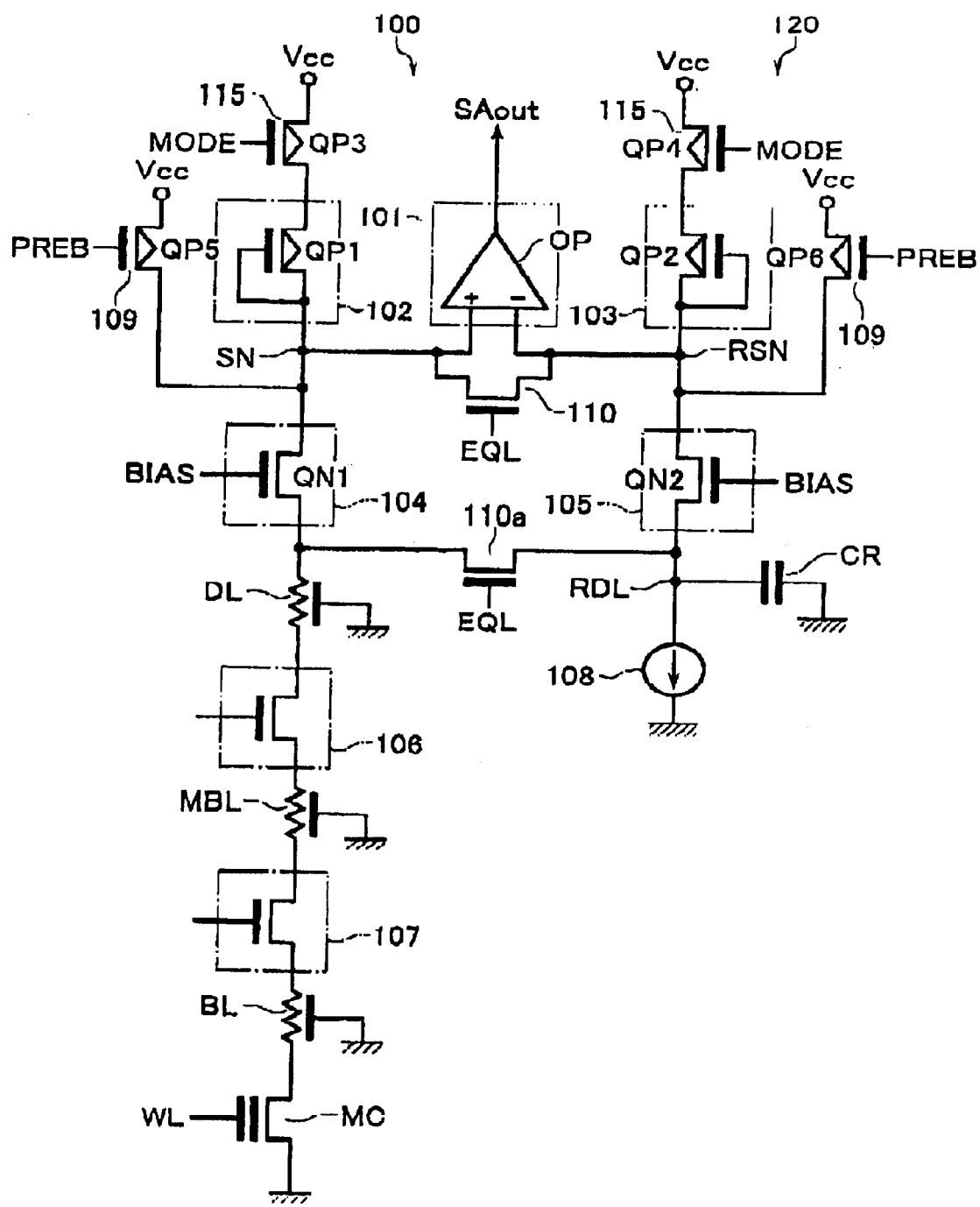
FIG. 13 is a diagram showing an exemplary configuration of a sense amplifier circuit used in the read circuit of FIG. 10.

FIG. 13 shows a configuration example of a sense amplifier 100 for use in the sense amp arrays 91, 93. The main part or "core" of this sense amp is a differential amplifier 101. This differential amplifier 101 has input terminals one of which is connected to a sense line SN and the other of which is coupled to a reference sense line RSN. Connected to the sense line SN to a current source load 102 which consists essentially of a P-channel metal oxide semiconductor (PMOS) transistor QP1 with its gate and drain coupled together. Likewise, the reference sense line RSN is such that a current source load 103 formed of a gate/drain-coupled PMOS transistor QP2 is connected thereto.

PMOS transistors QP3, QP4 for use as power switches 115 are inserted between the current source load 102 and power supply voltage Vcc and between current source load 103 and supply voltage Vcc, respectively. These PMOS transistors QP3–QP4 have gates which are controlled by the mode change signal MODE (or its inverted signal) so that the activation and inactivation of an entirety of sense amp is controlled in a way responsive to a read mode.

The sense line SN in connected to a data line DL through a clamping circuit (separator circuit) 104, which is formed of an N-channel MOS (NMOS) transistor QN1 having its gate to which a prespecified bias BIAS it applied. Similarly the reference sense line RSN is connected to a reference data line RDL via a clamp circuit 105, which is formed of an NMOS transistor QN2 having its gate to which a specified bias BIAS is given. These clamp circuits 104, 105 are provided for suppressing potential amplitudes of the data line DL and reference data line RDL to thereby allow sense line SN and reference sense line RSN to potentially swing significantly.

The reference data line RDL is associated with a current source 108 connected thereto. This current source 108 permits flow of an intermediate current between the current values of logic "0" and "1" data of a memory cell(s) MC connected to the data line DL. Data line DL has a large capacitance, since it is connected to a bit line BL through multiple stages of column gate transistors 106 and 107. Accordingly, a dummy data-line capacitance CR is coupled to the reference data line RDL in such a way that it becomes substantially the same load capacitance as the above-stated capacitance of data line DL.

The reference sense line RSN, the current source load 103 connected thereto, and part of the reference data line RDL to which reference sense line RSN is connected via the clamp circuit 105 make up a reference voltage generation circuit 120. With such an arrangement of the reference voltage generator circuit 120, a reference voltage of data sense on each sense line SN is given to the reference sense line RSN.

A precharge circuit 109 in connected to the sense line SN and reference sense line RSN. In this example the precharge circuit 109 is made up of PMOS transistors QP5. QP6 and is driven by a precharge signal PRED, which is a negative logic pulse signal obtainable by inversion of a precharge signal PRE being generated based on an ATD pulse(s). With the use of this precharge circuit 109, the data line DL and reference data line RDL are precharged up to clamp levels determined by clamp circuits 104, 105 prior to data sensing.

An NMOS transistor, for example, is interposed as an equalizer circuit 110 between the sense line SN and reference sense line RSN. Control this equalize circuit 110 by an equalize signal EQL so that an operation is performed for electrically shorting between the sense line SN and reference sense line RSN to thereby set them at the same potential prior to data sensing. Alternatively as shown in FIG. 13, it is also possible to interpose an equalize circuit 110a between the data line DL and reference data line RDL rather than between sense line SN and reference sense line RSN.

Figure 14:
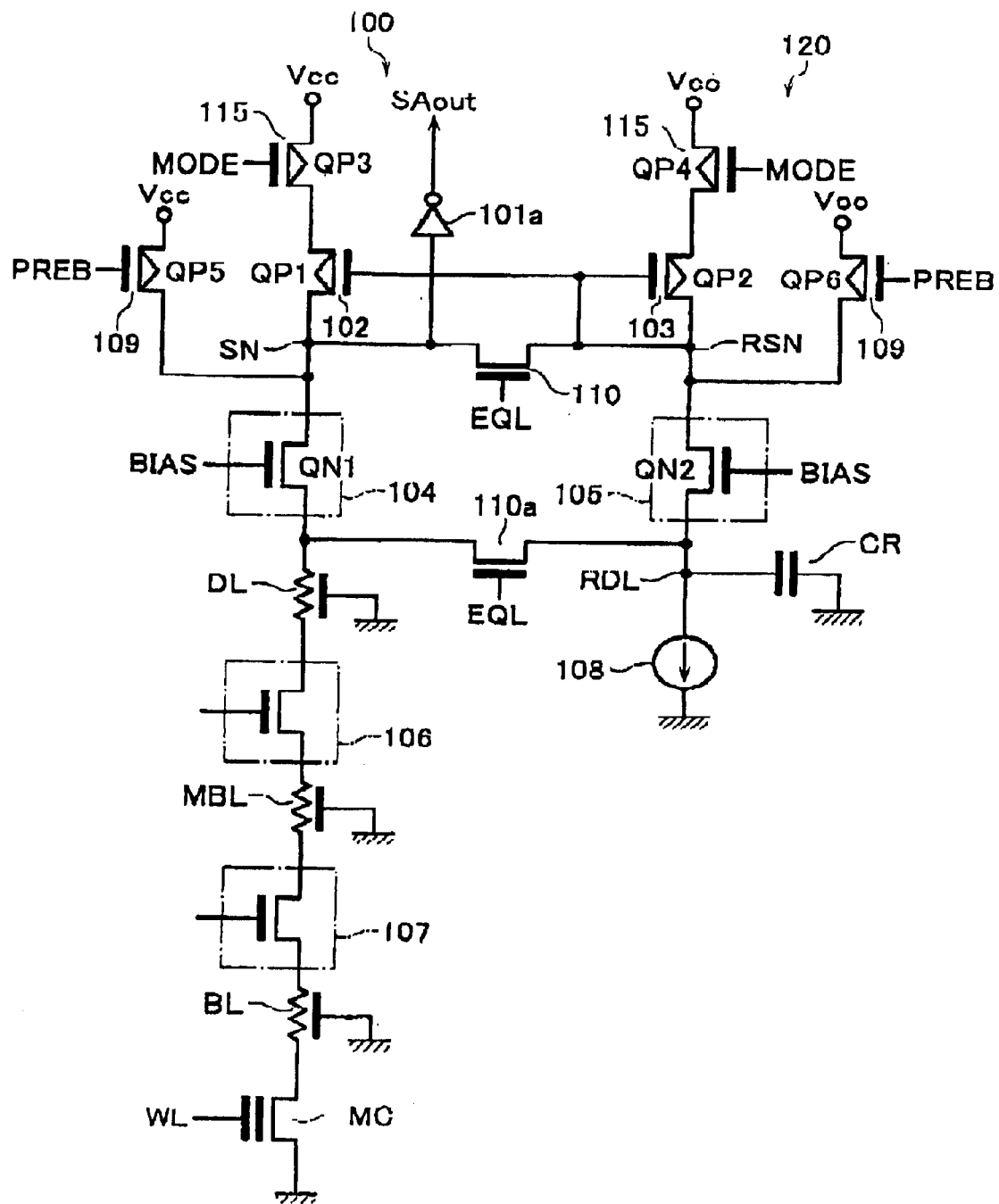
FIG. 14 is a diagram showing another exemplary configuration of the sense amplifier circuit.

FIG. 14 shows another exemplary configuration of the circuitry including the sense amplifier 100 and reference voltage generator circuit 120. In this example the sense-amp core part employs an inverter 101a. As the sense-amp core is not a differential amplifier, a current source load 103 which is connected to the reference sense line RSN and a current source load 102 connected to the sense line SN make up a current-mirror circuit. More specifically, the PMOS transistor QP2 of current source load 103 in such that its gate and drain are commonly connected together to reference sense line RSN, whereas the PMOS transistor QP1 for use as the current source load of sense amp 100 has its gate coupled to reference sense line RSN.

Figure 15A:
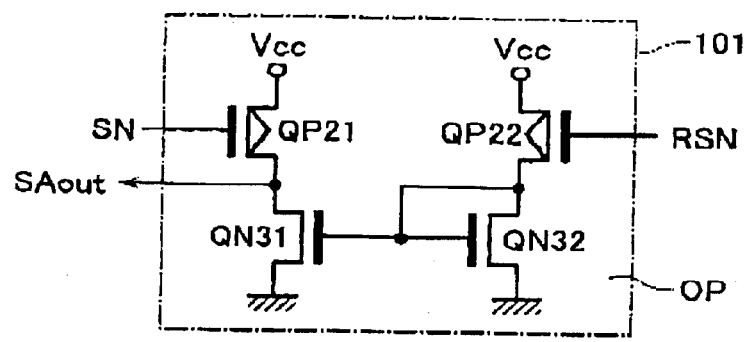
FIGS. 15A to 15C are diagrams each showing an exemplary configuration of a differential amplifier in the sense amp circuit of FIG. 13.
Figure 15B:
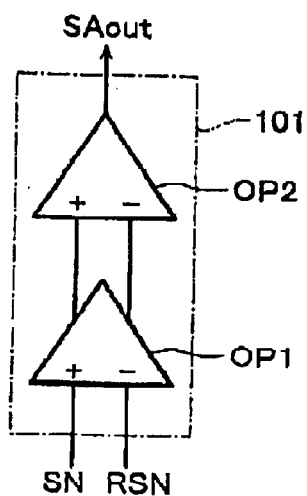
Figure 15C:
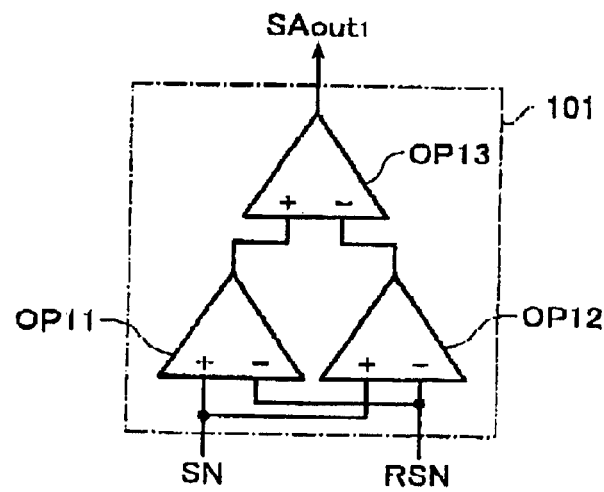

The differential amplifier 101 is configurable as shown in any one of FIGS. 15A to 15C. FIG. 15A shows an example using a single operational amplifier OP having a pair of differential PMOS transistors QP21, QP22 and a current-mirror load formed of a pair of NMOS transistors QN31, QN32. FIG. 15B is an example using two stages of operational amplifier OP1, OP2. FIG. 15C is an example using at an input stage a parallel combination of two op-amps OP11, OP12 and an opamp OP12 provided at an output stage for performing subtraction processing between outputs of them.

Figure 16A:
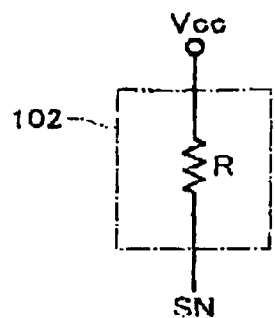
FIGS. 16A and 16B are diagrams each showing an exemplary configuration of a current source load in the sense amp circuits of FIGS. 13–14.
Figure 16B:
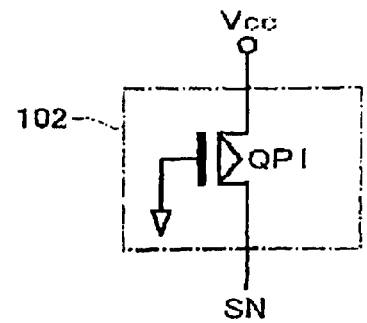

The load 102 may be arranged to use a resistor R as shown in FIG. 16A or alternatively use a PMOS transistor QP1 with its gate coupled to ground an shown in FIG. 16B.

Figure 17A:
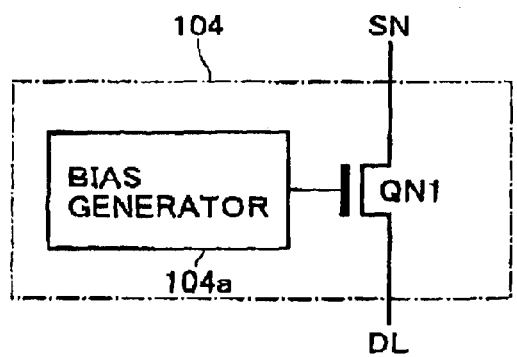
FIGS. 17A–17B are diagrams each showing a configuration of a separator circuit in the sense amp circuits of FIGS. 13–14.
Figure 17B:
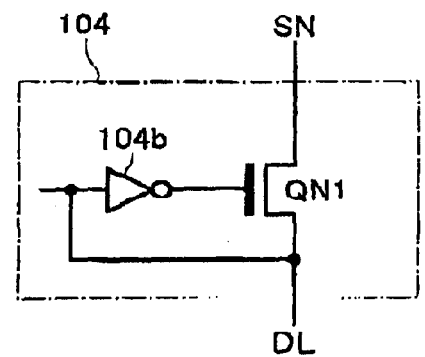

Regarding the clamp circuit 104, this may be arranged to provide a bias voltage generator circuit 104a for driving the gate of NMOS transistor QN1 as shown in FIG. 17A. Alternatively as shown in FIG. 17B, the clamp circuit is designed as a circuit of the feed-back type, which uses an inverter 104b to feed back the voltage potential of data line DL to thereby control the gate of NMOS transistor QN1. In this case the clamp circuit's bias voltage generator circuit 104 is preferably shared by the sense line SN and reference sense line RSN. With such sharing scheme, it is possible to cause noises mixing into or "riding on" a bias voltage BIAS upon start-up of a sense operation on the core side to be the same an such noises on the reference side.

Figure 18A:
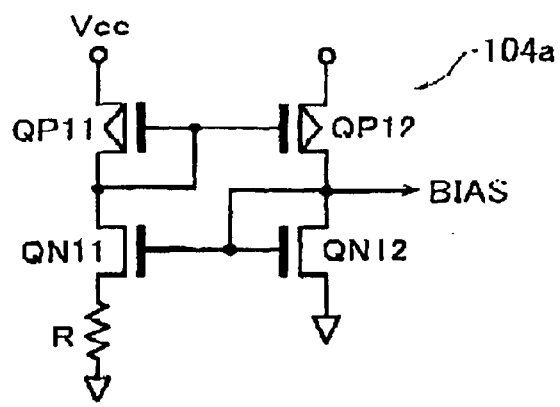
FIGS. 18A–18C are diagrams each showing an exemplary configuration of a bias circuit used in the separator circuit.
Figure 18B:
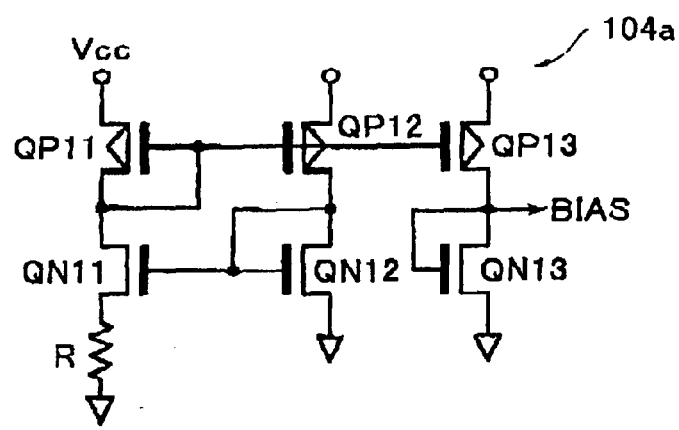
Figure 18C:
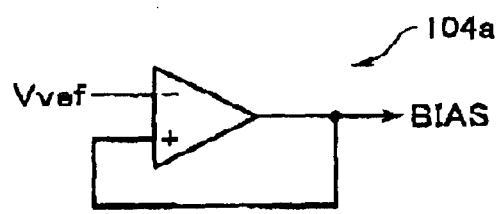

The bias voltage generator circuit 104a of FIG. 17A is may be arranged as shown in FIGS. 18A to 18C. FIG. 18A shows a reference voltage generator circuit using in combination a PMOS current-mirror formed of PMOS transistors QP11–QP12 and an NMOS current-mirror of NMOS transistors QN11–QN12 along with a resistor R. A circuit of FIG. 18B is similar to that shown in FIG. 18A with an output circuit added thereto. This output circuit is configured from a current source PMOS transistor QP13 with its gate connected to the gates of PMOS transistors QP11–QP12 and a diode-coupled NMOS transistor QN13. FIG. 18C is an example which uses as the bias voltage generator circuit 104a a voltage follower operable to transfer an appropriate reference voltage Vref.

Figure 19:
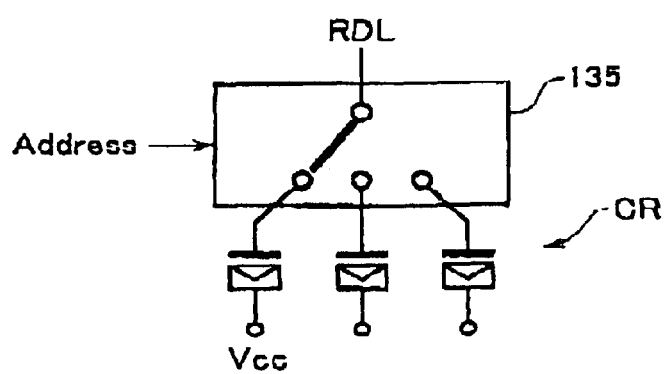
FIG. 19 is a diagram showing an arrangement of a dummy capacitor of a reference sense line in the sense amp circuits of FIGS. 13–14.

FIG. 19 depicts a practical configuration example of the dummy data-line capacitance CR as connected to the reference data line RDL. Here, as the dummy dataline capacitance CR, a plurality of capacitance-different PMOS transistors each having its source and drain coupled to supply voltage Vcc are disposed so that any one of them is selectable by a changeover or switch circuit 135. As shown in FIG. 1, in case a great number of cell blocks are disposed so that these are selectively connected to a data line, the sense amplifiers included in the read circuit 12 would change or vary in load capacitance in a way responsive to the position of a cell block to be presently selected. Consequently, control the switch circuit 135 in responding to an address signal to switch and select an appropriate one from among the preset values of the dummy dataline capacitance CR in accordance with the selected position of a cell block, thereby making it possible to retain adequate capacitance balance between the data line and reference data line in any events.

So far, the fundamental or basic configuration of the sense amplifier circuitry used in the read circuit 10 has been explained. Presented below is an explanation of problems faced with the sense amp circuitry along with other possible forms of the sense amp circuit scheme for avoiding such problems.

As the data line DL is inherently large in load, it is required for high-speed sensing to perform data detection while reducing the voltage amplitude thereof to a limited level. To do this the clamp circuit 104 that suppress the voltage amplitude of data line DL is provided between the data line DL and the sense line SN as shown in FIG. 13 or FIG. 14. Use of this clamp circuit 104 enables the data line DL to be separated or disconnected from sense line SN, which in turn makes it possible to lessen the capacitance of sense line SN.

Figure 20:
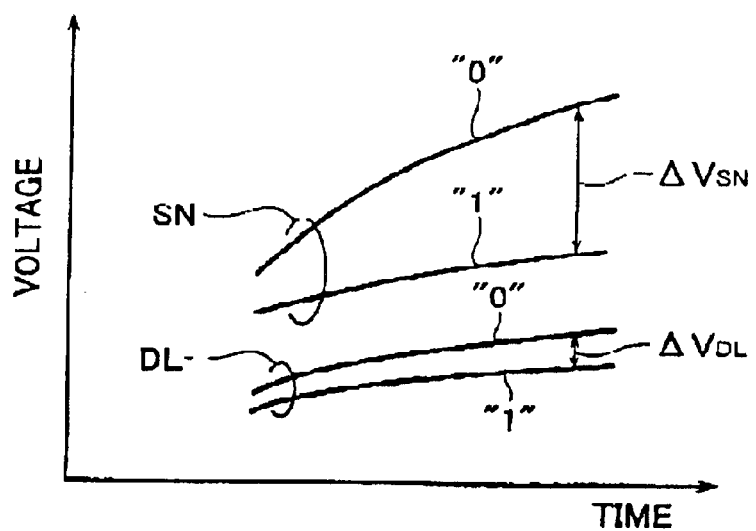
FIG. 20 is a diagram graphically showing voltage potential changes of data and sense lines at the time of data readout.

More practically, the relationship of voltage amplitudes of the data line DL and sense line SN when read data is of logic "0" and when the read data is at logic "1" are as shown in FIG. 20. A voltage amplitude $\Delta V_{SN}$ of "0" and "1" data on sense line SN it set to about four times greater than a voltage amplitude $\Delta V_{DL}$ of data line DL. While provision of such clamp circuit results in a decrease in capacitance of sense line SN, the balance in capacitance between sense line SN and reference sense line RSN can also affect the sensing speed. More specifically, the capacitance of sense line SN is approximately one tenth (1/10) of that of data line DL so that 30 percent (%), or more or less, of the amount of charge to be charged when looking at from the load 102 is consumed for charge-up of the capacitance of sense line SN. Due to this, if the capacitances of sense line SN and reference sense line RSN are failed to be identical in value to each other, then a difference takes place between chargeup speeds of the both, resulting in occurrence of a delay in data sensing. To be brief, in order to perform data sensing at high speeds, it is important to establish well-balanced capacitances of sense line SN and reference sense line RSN while at the same time providing capacitive balancing between data line DL and reference data line RDL.

Another functionality of the clamp circuit 104 lies in suppression of a drain voltage being given during reading to a bit line BL of the cell array through the data line DL. During reading, in order to detect whether a current is present or absent, apply a positive read voltage from a word line WL to the control gate of a memory cell while applying a positive drain voltage from the bit line BL. This voltage relationship is the same as that during data "0" writing: if the drain voltage is high in potential, then scant write (soft write) phenomenon would take place. To avoid this, it is required to lower the drain voltage to the extent that the memory cell MC does not perform any pentode operation. It to the clamp circuit 104 that attains this function.

Figure 21:
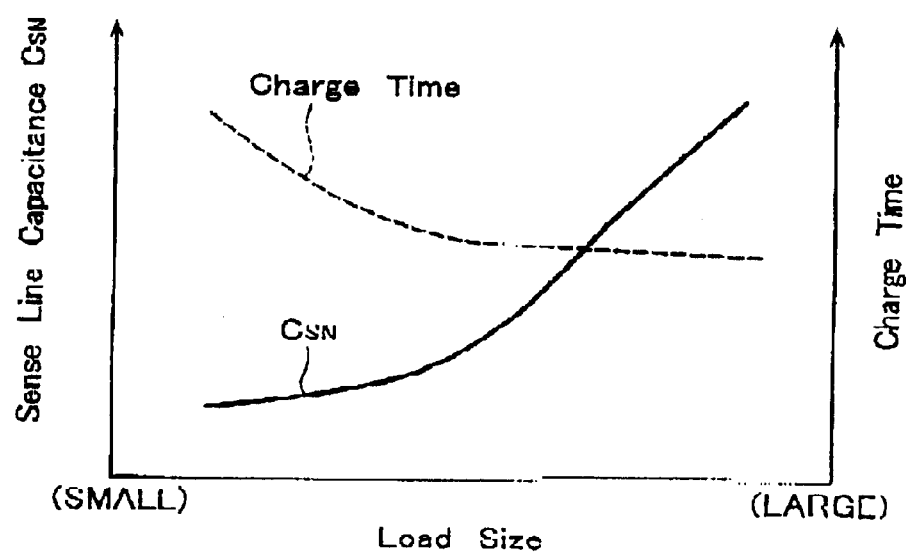
FIG. 21 is a diagram graphically showing a relationship of a sense line capacitance versus the load size of a sense amp circuit and also a relation of a sense-line chargeup time versus the sense-amp load size.

On the other hand, in order to perform high-speed chargeup of the sense line SN, it is effective to enlarge the transistor size (channel width) of the current source load 102. Unfortunately, this approach per se has a limit. This point will be set forth in greater detail. See FIG. 21, which is a graph showing the relationship of the transistor size of current source load 102 versus chargeup time and sense-line capacitor $C_{SN}$. While the load transistor stays small in size, the capacitance of sense line SN and the capacitance of other circuitry as connected to the sense line SN rather than the capacitance of load transistor are dominant ones that take control of the chargeup speed, wherein the sense-line capacitance $C_{SN}$ is less in inclination or gradient. On the contrary, when the load transistor becomes larger in size, the load transistor's gate capacitance and junction capacitance become relatively large, resulting in an increase in increment curve of the sense-line capacitance $C_{SN}$. The chargeup time is as follows: while the load transistor size remains small, it rapidly decreases with an increase in transistor size; when the size becomes larger beyond a prespecified level, a time taken for chargeup of itself becomes a dominant factor which controls the entirety, resulting in the gradient becoming smaller. From the foregoing, it can be seen that there is a limit against the approach to merely enlarging the load transistor size in order to accelerate sense-line chargeup.

Furthermore, in case the page mode is built in the chip as in this embodiment, a need is felt to lay out multiple sense amplifiers which correspond in number to at least one page (=8 words=123 bits). Unfortunately, because sense amps of the current read type require association of a reference data line provided with the dummy data line capacitor with large capacitance and large area as stated previously, simply disposing a great number of sense amps can result in an unwanted increase in chip area due to the presence of such dummy dataline capacitance.

Figure 22:
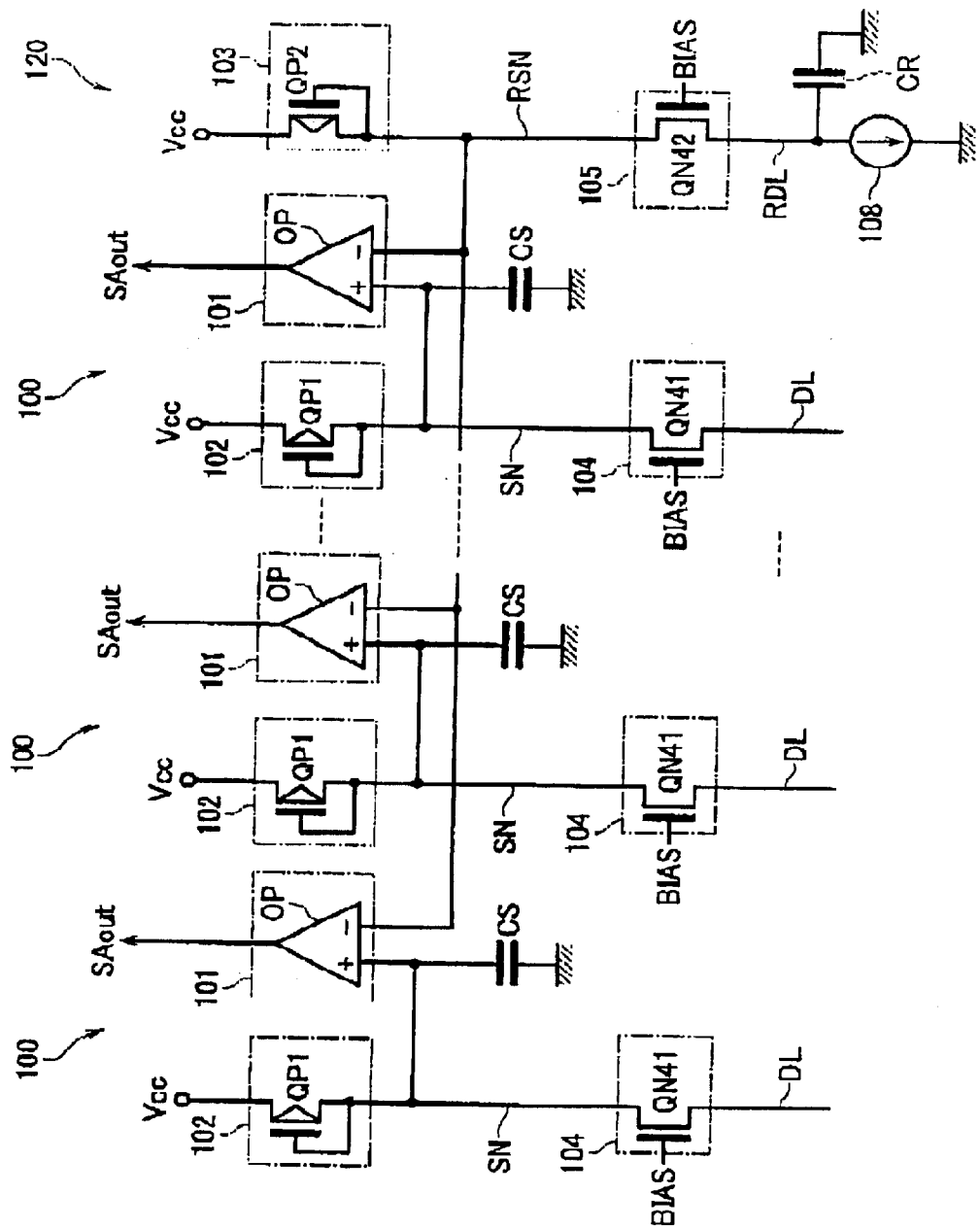
FIG. 22 is a diagram showing a sense amp circuit scheme for sharing a reference voltage generator circuit.

An exemplary configuration of a sense amplifier circuit designed to take into account of the points stated above is shown in FIG. 22. Although plural sense amplifiers corresponding in number to one page—say, one page of sense amps—are laid out in order to perform a page-mode operation as stated previously, an appropriate number (e.g. one word) of sense amps 100 included therein are arranged to share a reference voltage generator circuit 120. FIG. 22 depicts only a certain range of the sense amps 100 sharing one reference voltage generator circuit 120.

Core part of each sense amplifier 100 is a differential amplifier 101 which is similar to that shown in FIG. 13. Differential amplifiers 101 have non-inverting input terminals which are connected to independent sense lines SN respectively and also have inverting inputs commonly coupled together to a reference sense line RSN. Each sense line SN is connected to power supply voltage Vcc through a current source load 102. Similarly the reference sense line RSN is coupled to supply voltage Vcc via a current source load 103.

Figure 23:
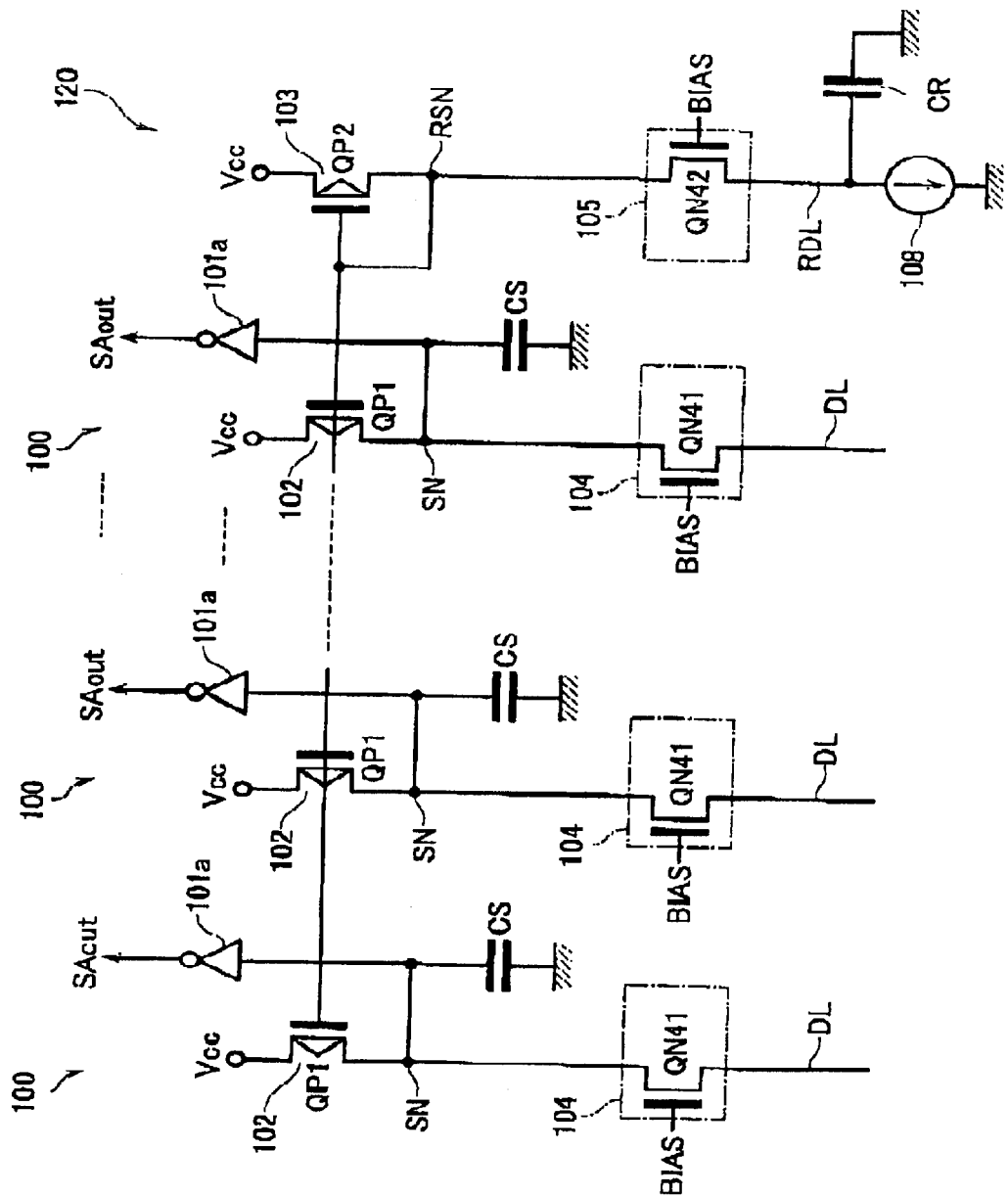
FIG. 23 is a diagram showing a sense amp circuit scheme for sharing a reference voltage generator circuit.

FIG. 23 shows a circuit configuration of the type using a similar scheme for allowing a plurality of sense amplifiers 100 to share a reference voltage generator circuit 120, with an inverter 101a added to each sense-amp core in a similar manner to that of FIG. 14.

Letting multiple sense amps 100 share the reference voltage generator circuit 120 in a way shown in FIG. 22 or FIG. 23 causes the reference sense line RSN to be associated with a plurality of sense amps, which would result in occurrence of an impermissible capacitance off-balance of sense line SN and reference sense line RSN. To perform data sensing at high speeds, it is also important to set the data line DL and reference data line RDN in a well-balanced state while at the same time letting the sense line SN and reference sense line RSN be well balanced.

In view of this point, a dummy sense-line capacitor CS is added to each sense line SN as shown in FIGS. 22 and 23. In this way, the individual sense line SN is intentionally enlarged in capacitance in a way proportional to an increase in capacitance of the reference sense line RSN as resulted from connection of plural sense amps to reference sense line RSN to thereby guarantee that the sense line SN and reference sense line RSN become substantially the same in capacitance value as each other.

Preferably these dummy sense-line capacitors CS are arranged using PMOS transistors in a similar way to the capacitor CR that in connected to the reference data line RDL. A practically implemented example to that a certain number—this is equal to a sense amp number minus 1—of NMOS transistors are provided in parallel, each of which has its gate area being the same an that of an input-stage PMOS transistor of a differential amp 101 which makes up the sense-amp core. Likewise, the dummy senseline capacitors CS in the case of FIG. 23 are such that a specific number (sense-amp number minus 1) of PMOS transistors are provided in parallel, each having a gate area which is the same as that of the PMOS transistor of current source load 102.

Employing the scheme for allowing multiple sense amps to share a reference voltage generator circuit in the way stated above makes it possible to lessen the area of read circuit of a page mode built-in chip which requires a number of sense amplifiers. Additionally in such case, it is possible to achieve high-speed accessibility while using the arrangement with multiple sense amps snaring a reference voltage generator circuit, by adding dummy sense-line capacitors CS to sense lines SN to thereby establish capacitive balancing relative to the reference sense line RSN.

In case both the page mode-use sense amp array 91 and word mode-use sense amp array 93 are prepared as shown in FIG. 10 for example, the above-noted reference voltage generator circuit sharing scheme is effectively applicable to at least the page-mode sense amp array 91 side. Applied to the word-mode sense amp array 93 side may be a standard scheme for setting the ratio of sense line SN to reference sense line RSN at "1:1"—namely, let a single sense amp have a single reference voltage generator circuit in an ordinary way. Alternatively, regarding word-mode sense amp array 93 also, it is obviously permissible to use the scheme for letting multiple sense amps share a reference voltage generator circuit in a similar way to the page-mode sense amp array 91.

Figure 37:
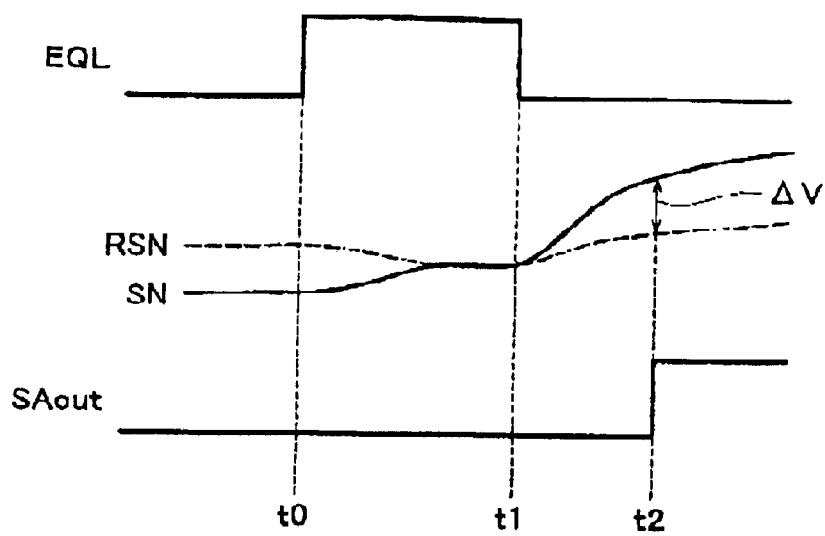
FIG. 37 is a timing diagram for explanation of an equalize operation and a data sensing operation.

Although not specifically shown in FIGS. 22–23, an equalizing circuit 110 is provided between the sense line SN and reference sense line RSN am shown in FIG. 13 or 14, for electrically shortcircuiting between these sense line SN and reference sense line RSN and thus shorting between the data line DL and reference data line RDL to thereby act them at the same potential level prior to execution of data sensing. As shown in FIG. 37, the equalizer circuit 110 is selectively driven and rendered operative by an equalize signal EQL to short between sense line SN and reference sense line RSN. It is necessary for achievement of high-speed sense operations to set the time width of such equalize signal EQL at an optimal value which is required to electrically short sense line SN and reference sense line RSN together. After equalize signal EQL becomes at "L" level to stop or interrupt an equalize operation, a voltage difference $\Delta V$ between sense line SN and reference sense line RSN increases in accordance with a voltage difference between data line DL and reference data line RDL, resulting in a sense output SAout being obtained when such difference voltage $\Delta V$ reaches a specified value.

Figure 38:
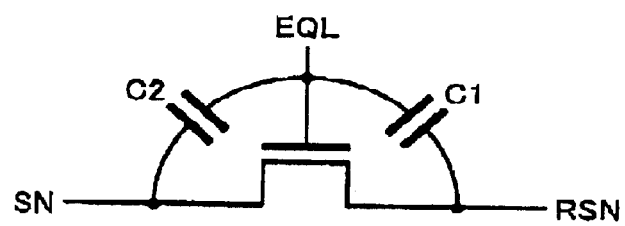
FIG. 38 is a diagram showing equivalent circuitry of capacitive coupling by an equalize transistor.
Figure 39:
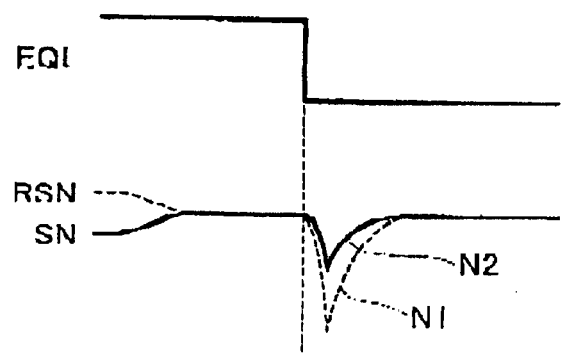
FIG. 39 is a diagram showing switching noises due to the equalize circuit.

If the equalize signal EQL is too short in time width, then any reliable equalization in no longer expectable. This causes read failures or alternatively results in a delay in sense operation due to the necessity of reversing the voltage difference between sense line SN and reference sense line RSN in a way depending upon data. In case the equalize signal EQL is too long in time width, this also causes delay of sense operation. Additionally, what should be cautioned about the equalizer circuit 110 is the behavior of switching noises. As shown in FIG. 38, a MISFET making up the equalizer circuit must have a capacitance component C1 between its gate and source and a capacitance C2 between the gate and drain thereof. The presence of these capacitances C1, C2 causes large switching noises N1, N2 to be superimposed on the reference sense line RSN and sense line SN at the time of equalization interruption—that is, when equalize signal EQL potentially changes from "H" to "L" level—as shown in FIG. 39.

Examples of preferable equalizer circuitry that is improved to avoid the problems will be explained below.

[Equalize Circuit]

Figure 24:
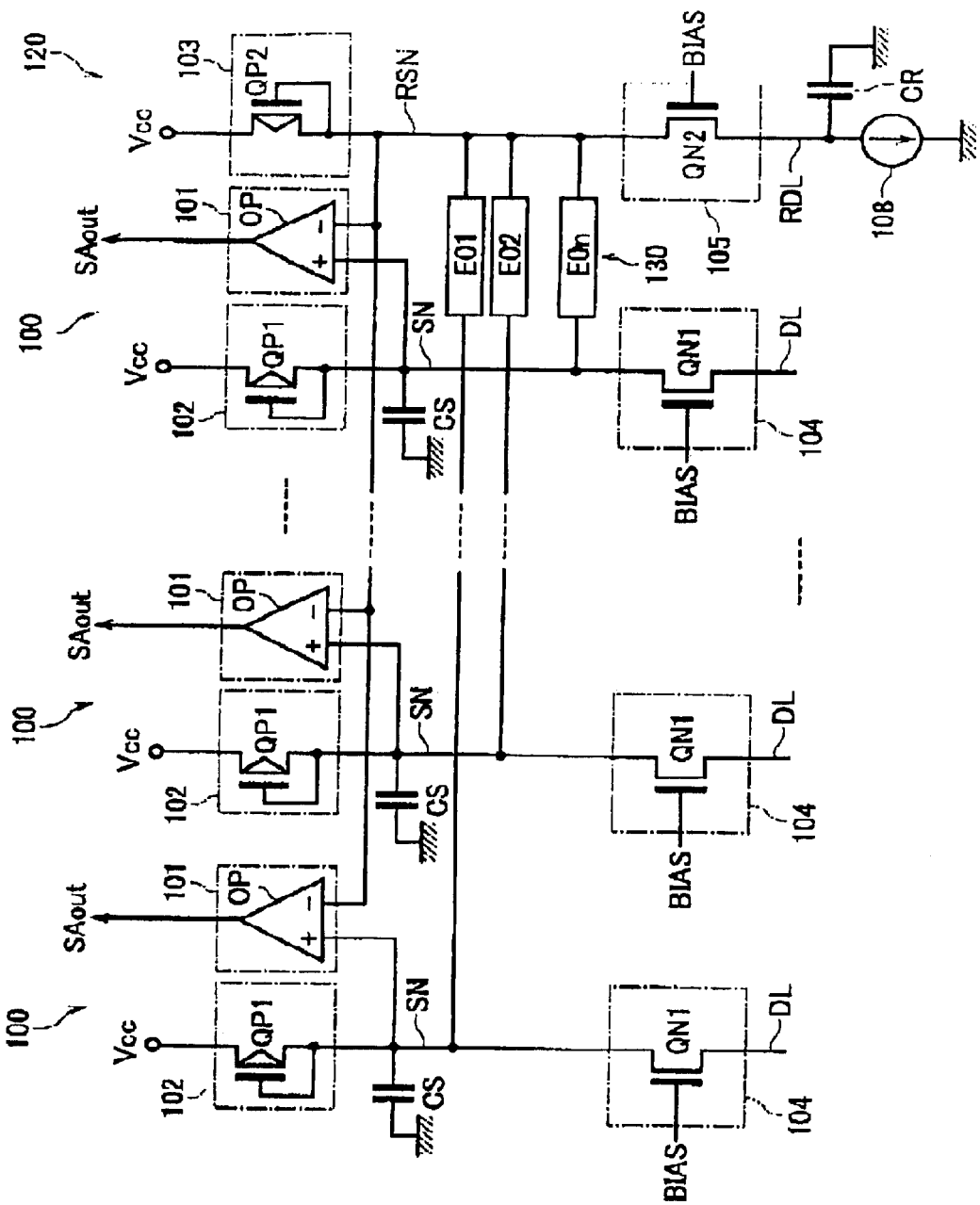
FIG. 24 is a diagram showing a sense amp circuit with an equalizer circuit added to the sense amp circuit of FIG. 22.

FIG. 24 shows a configuration of circuitry which is designed based on the arrangement of FIG. 22 with n (n is an integer) equalize circuits E01, E02, . . . , E0n interposed between each sense line SN of sense amplifier 100 and a reference sense line RSN. An equalize circuit group 130 made up of these equalizers E01, E02, . . . , E0n is for electrically shorting, before data sensing, between each sense line SN and the reference sense line RSN to thereby set them at the same potential level, simultaneously, equalize circuit group 130 is also operable to initialize at the same potential level a data line DL being connected to each sense line SN and a reference data line RDL coupled to the reference sense line RSN. A detailed configuration of this equalize circuit group 130 will be discussed later. Note that equalize circuit group 130 may alternatively be interposed between the data line DL and reference data line RDL as explained in FIG. 13 or FIG. 14.

Figure 25:
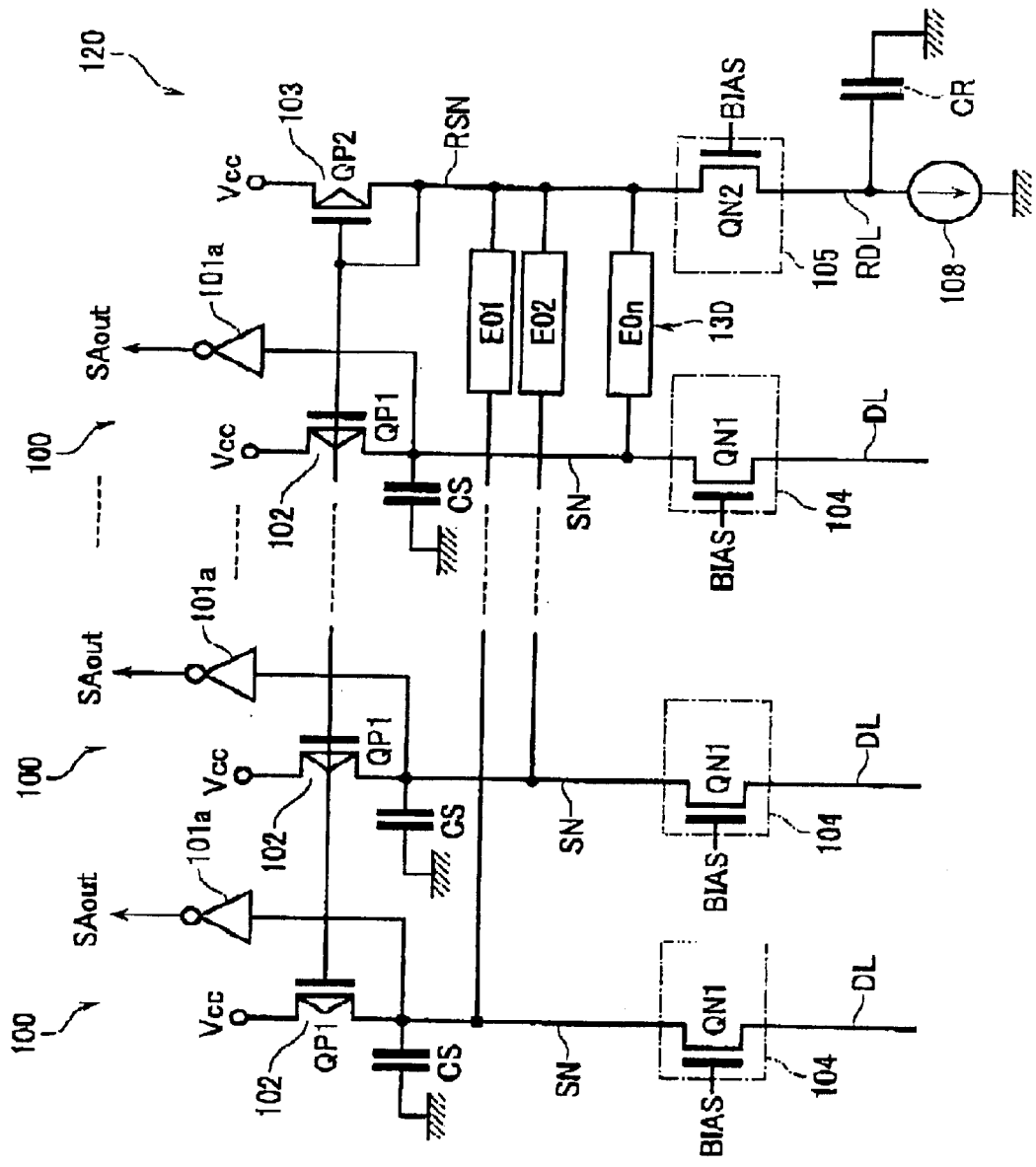
FIG. 25 is a diagram showing a sense amp circuit with an equalize circuit added to the sense amp circuit of FIG. 23.

FIG. 25 shows an example which is arranged based on the configuration of FIG. 23 with n equalize circuits E01, E02, . . . , E0n interposed between each sense line SN of a sense amplifier 100 and the reference sense line RSN, wherein the sense amp 100 uses an inverter 101a as a sense-amp core.

Figure 26:
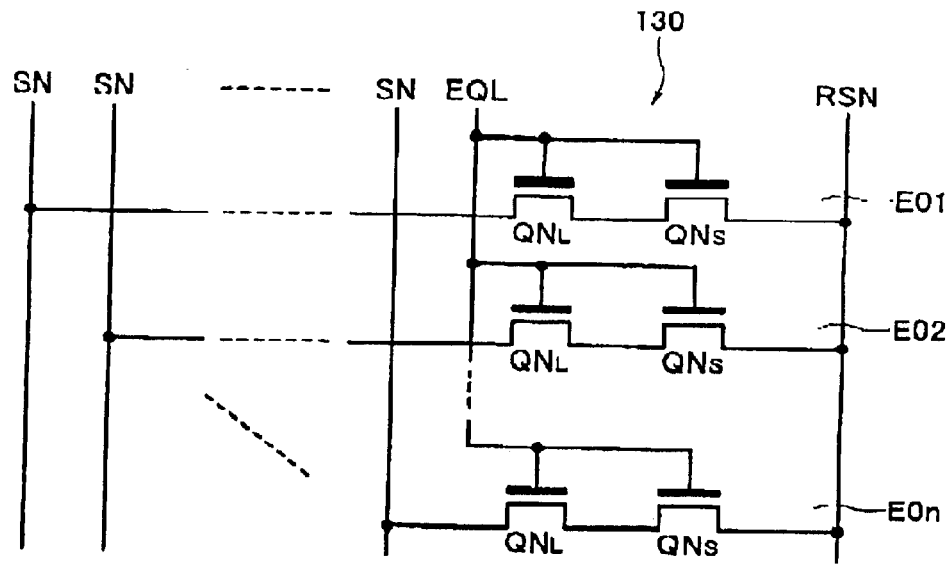
FIG. 26 is a diagram showing an exemplary configuration of the equalize circuits of FIGS. 24 and 25.

FIG. 26 shows a detailed configuration of the equalize circuit group 130 shown in FIGS. 24 and 25. Each equalize circuit E01, E02, . . . , is formed of a aerial combination of two NMOS transistors QNL, QNS. These NMOS transistors QNL, QNS have their gates which are simultaneously controllable by an equalize signal EQL. Note here that the NMOS transistors QNL with its one end connected to a sense line SN is larger in gate area than the NMOS transistor QNS with its one end coupled to reference sense line RSN. One practical example is that in case reference sense line RSN is shared by n sense lines SN, the gate area of NMOS transistor QNL is n times greater than that of NMOS transistor QNS.

Figure 27:
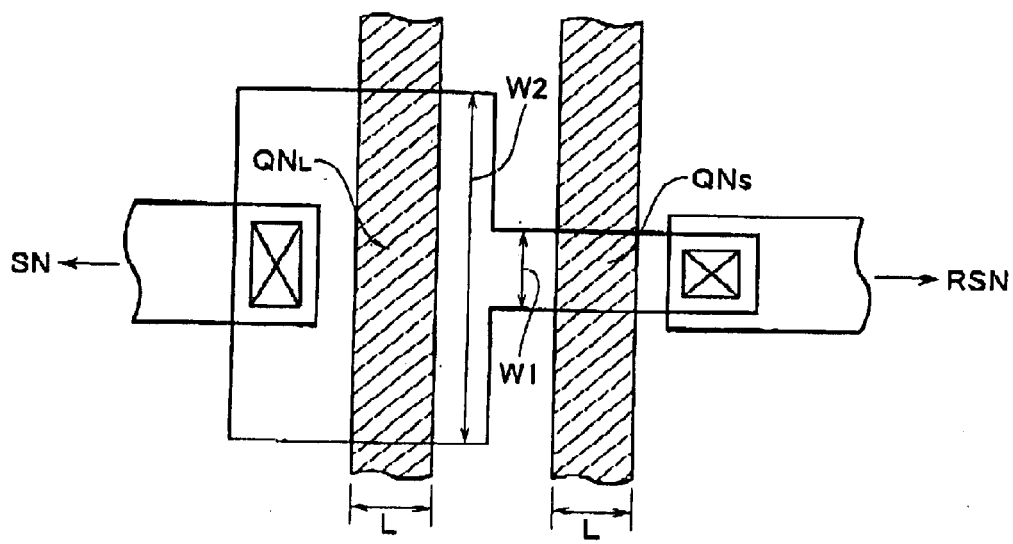
FIG. 27 is a diagram showing a layout of the equalize circuit.

FIG. 27 shows a layout example of such equalizer circuit. When letting the two NMOS transistors QNL, QNS be the same in channel length L as each other, the channel width is set to W2=n×W1.

Figure 28:
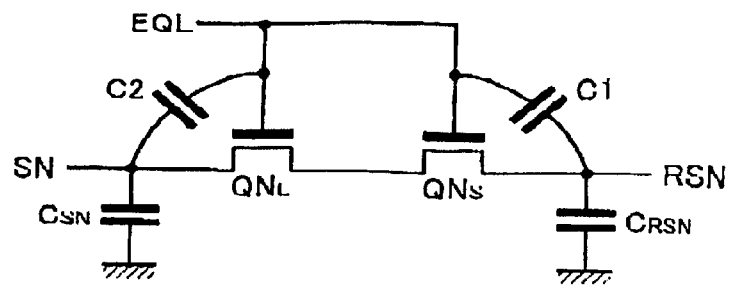
FIG. 28 is a diagram showing equivalent circuitry of capacitive coupling of the equalize circuit.

In this way, by making the transistor size of equalizer circuit different from each other an seen from each sense line SN and the reference sense line RSN, it becomes possible to reduce the influenceability of switching noises otherwise occurring due to a difference in number between equalize circuits mean from each sense line SN and reference sense line RSN. As shown in FIG. 28, the coupling capacitances C2, C1 between the gates of two translators QNL, QNS and their associated sense line SN and reference sense line RSN are given as C2=n·C1 in view of the gate area difference. On the other hand, the capacitance C1 due to n equalize circuits is coupled to reference sense line RSN. In short, the capacitive coupling from the gate to sense line SN is performed through a single large capacitance C2, whereas the capacitive coupling to reference sense lines RSN is done via n small capacitances C1.

Accordingly, the use of equalize circuitry with a combination of MOS transistors having the above-noted gate area ratio makes it possible to allow switching noises induced onto a sense line SN and reference sense line RSN to be almost the same in magnitude as each other at the time of equalization interruption or removal. In other words, a potential difference between sense line SN and reference sense line RSN is retained irrespective of switching noises. As a result, it will no longer happen that data sensing is delayed due to unwanted reversal of the potential difference between sense line SN and reference sense line RSN upon application of switching noises thereto. Thus it becomes possible to achieve high-speed accessing.

It should be noted that coupling noises applying to the connection node or two NMOS transistors QNS, QNL are hardly transferred to the outside, because these NMOS transistors QNS, QNL are driven to turn off simultaneously.

Figure 29:
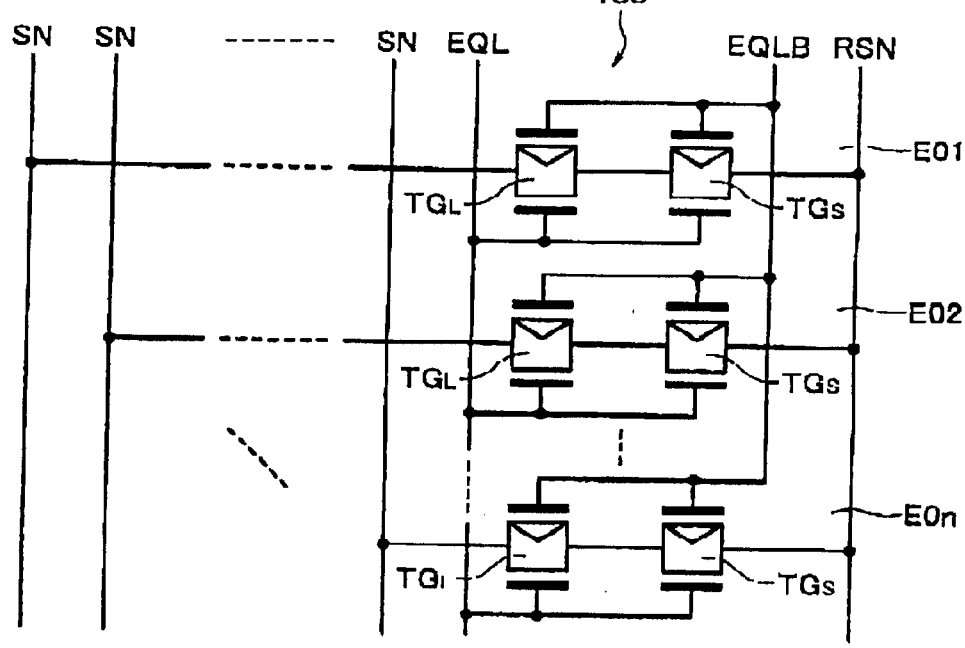
FIG. 29 is a diagram showing another configuration example of the equalize circuits of FIGS. 24–25.

FIG. 29 shows another configuration example of the equalize circuit group 130. Unlike the arrangement of FIG. 27, each equalize circuit E01, E02, . . . is formed of a serial combination of two complementary MOS (CMOS) transfer gates TGL, TGS, each having a parallel combination of an NMOS transistor and PMOS transistor. The gates of the NMOS transistor side and PMOS transistor side are controlled by complementary equalize signals EQL, EQLB. The circuit of FIG. 29 is similar to that of FIG. 26 using single-transistor based configuration in that the gate area of a CMOS transfer gate TGL being connected to a sense line SN is n times greater than that of a CMOS transfer gate TGS on the reference sense line RSN side.

In case the two series-connected CMOS transfer gates TGL, TGS are used as equalizer circuitry, no switching noises occur theoretically as far as NMOS and PMOS transistors are driven to turn on and off simultaneously. The reason of this is that when one equalize signal EQL potentially changes from "H" to "L" level, the other equalize signal EQLB changes from "L" to "H." resulting in cancellation of capacitive couplings. However, the equalize signals EQL, EQLB are ordinarily generated from a basic timing signal through stage number-different gates. Accordingly, a timing difference can occur between switching operations of the both. Thus, even in case such CMOS transfer gates are used, it becomes effective to serially connect together the two ones that are different in gate area from each other.

Figure 30:
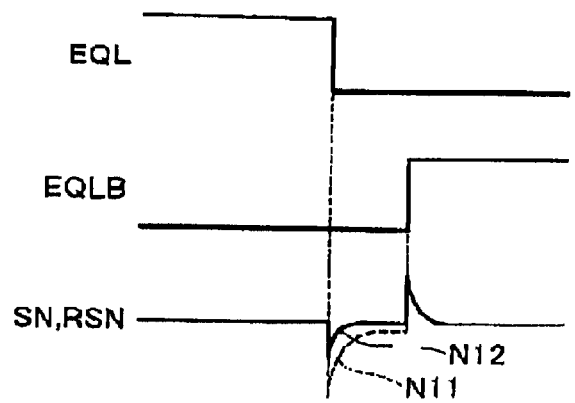
FIG. 30 is a diagram for explanation of switching noises of the equalize circuit.

However, in the case of using the CMOS transfer gates TGL, TGS, another problem arises due to a timing difference of the equalize signals EQL, EQLB. As shown in FIG. 30, if the equalize signal EQLB's transition of from "H" to "L" level is delayed with respect to an "H" to "L" transition of the equalize signal EQL, then the CMOS transfer gates TGL, TGS are encountered with a problem that a time period is generated in which the PMOS transistor fails to turn off even when the NMOS transistor turns off.

Figure 31:
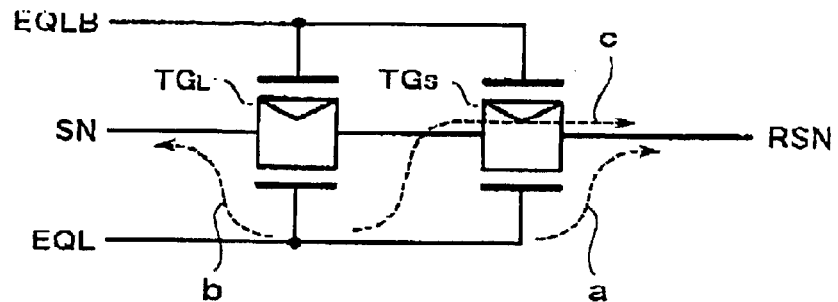
FIG. 31 is a diagram showing the way of noise transfer of the equalize circuit of FIG. 29.

In such event, an shown in FIG. 31, when switching noises a, b are injected from the gates of NMOS transistors of CMOS transfer gates TGL, TGS into the reference sense line RSN are sense line SN respectively, noises incoming from n equalize circuits coupled to a connection node of two transfer gates from the gate of larger transfer gate TGL are transferred as a noise c toward the reference sense line RSN through the PMOS transistor of the transfer gate TGS that fails to turn off.

Although noises being coupled to the connection node of two transfer gates from the gate of smaller transfer gate TGS also are transferred to the sense line SN through the PMOS transistor of the transfer gate TGL which does not turn off yet, such noises are negligible in magnitude when compared to the noise c. One reason of this is that the gate area is less. Another reason is that it is a single equalize circuit that is connected to each sense line SN.

As a result of this, as shown in FIG. 30, switching noise N11 applied onto the reference sense line RSN becomes larger than switching noise N12 applied to the sense line SN.

Figure 32:
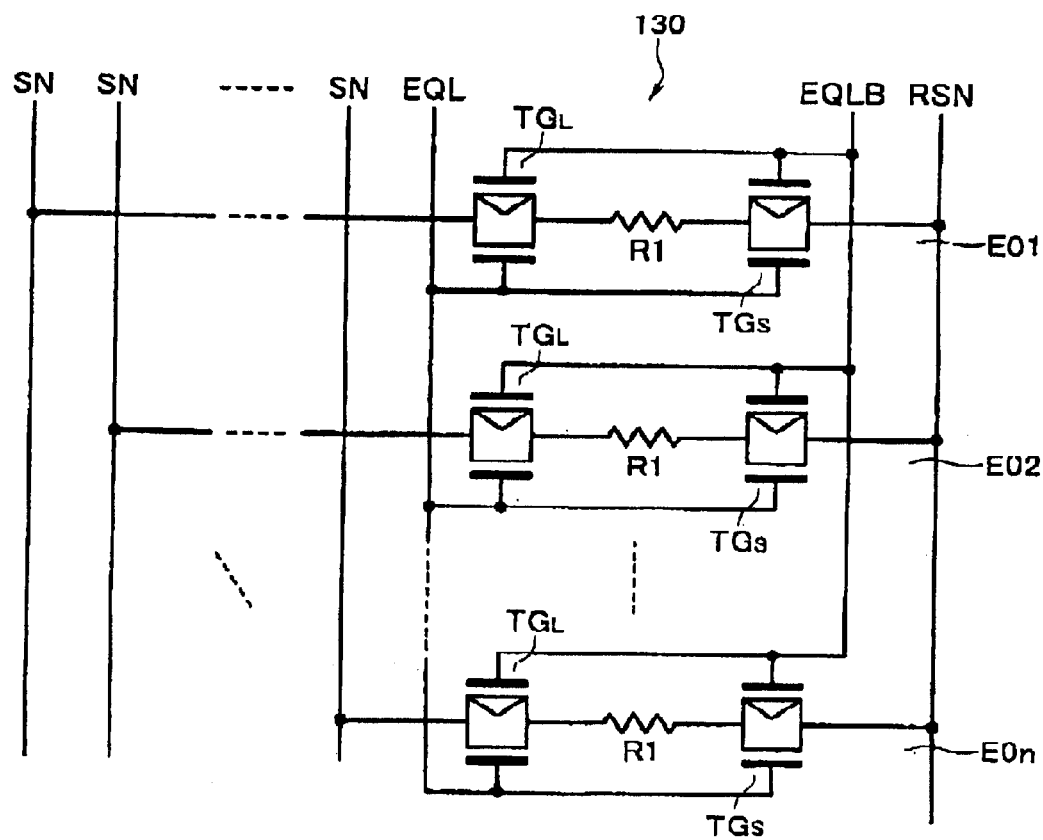
FIG. 32 is a diagram showing a configuration of another equalize circuit which enables noise reduction.

For such switching noises occurring due to the timing difference between the equalize signals EQL, EQLB, it is effective to connect a resistor R1 between two CMOS transfer gates TGL, TGS as shown in FIG. 32. With such an arrangement, it is possible to lessen the leakage noise c as set forth in conjunction with FIG. 31.

Figure 33:
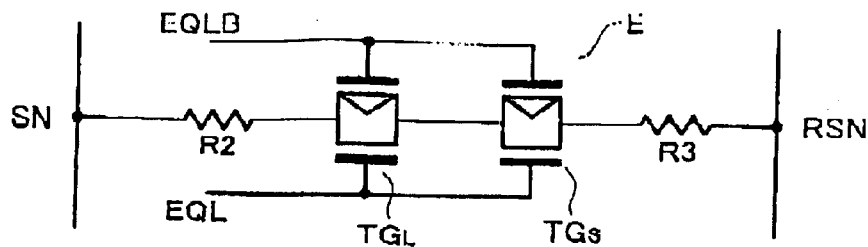
FIG. 33 is a diagram showing a configuration of another equalize circuit with noise reduction capability.

Further as shown in FIG. 33, it is also effective to insert resistor R2, R3 between two transfer gates TGL, TGS making up an equalize circuit E and the sense line SN and reference sense line RSN, respectively. Whereby, it is possible to suppress not only the leakage noise c occurring due to the equalize signals timing difference as explained in conjunction with FIG. 31 but also the noises a, b that are directly coupled to the reference sense line RSN and sense line SN from respective gates.

The resistors R1, R2, R3 shown in FIGS. 32 and 33 may be formed of diffusion-layer resistors, polysilicon film resistors, MOS transistors with constant voltage-applied gates, or other similar suitable resistive elements. Note however that those resistors with extra large resistance values are not usable because these resistors R1–R3 would limit the functionality of equalize circuitry.

The scheme for suppressing switching noises by use of one or more resistors shown in FIG. 32 or FIG. 33 should not be limited to the case of using CMOS transfer gates and may also be applicable to the case of the scheme for serially connecting together two one-conductivity channel MOS transistors in a way as explained with reference to FIG. 26. For example, in case two MOS transistors are spaced apart from each other and experience the creation of a timing difference even under the control by the same equalize signal, it becomes effective to perform noise reduction using resistors.

As previously stated, when the equalize circuit is constituted from CMOS transfer gates, switching noises inherently cause no problems as far as PMOS and NMOS transistors are driven to turn on and off simultaneously. An embodiment arranged in light of this fact will next be explained below.

Figure 34:
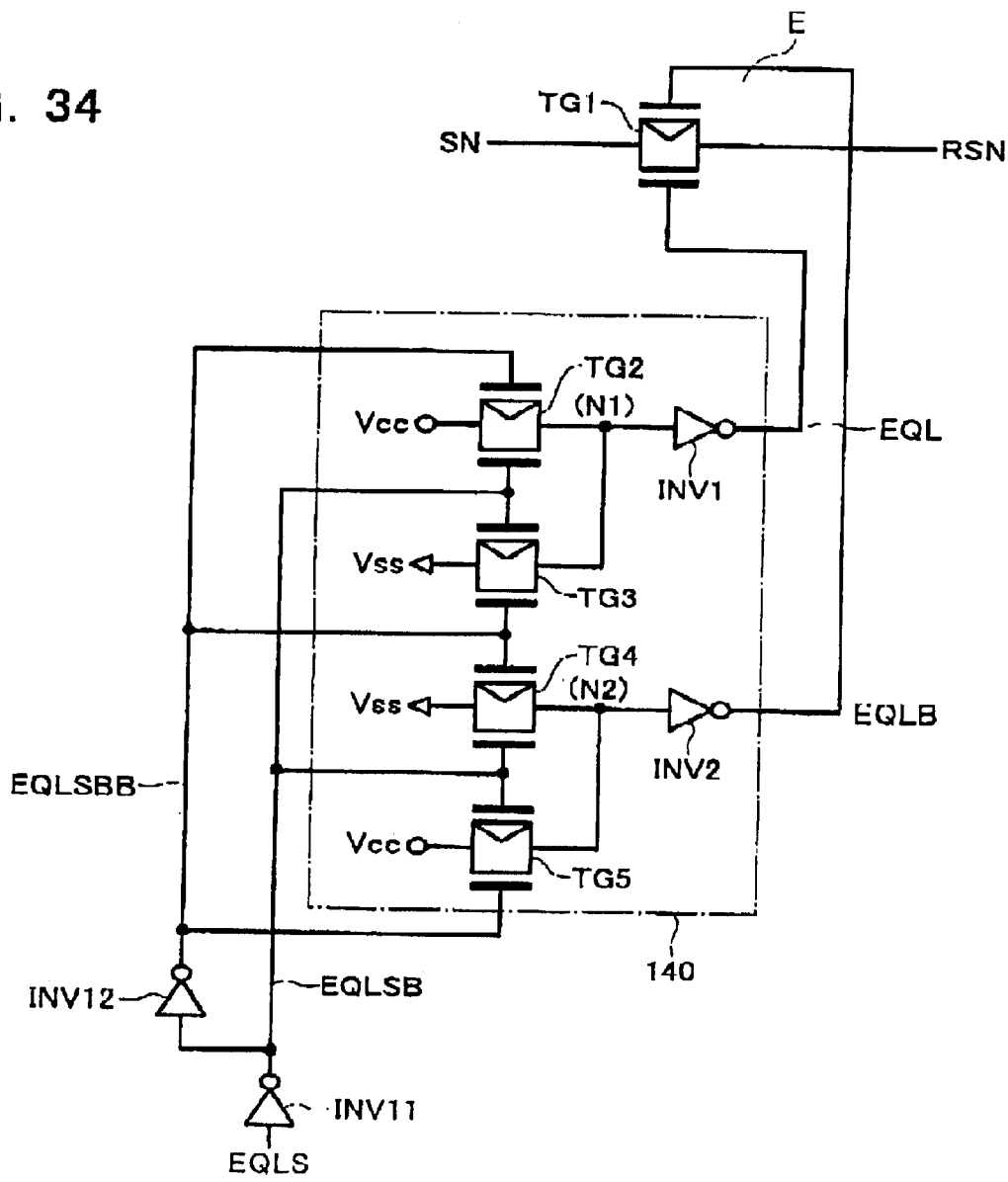
FIG. 34 is a diagram showing a timing control circuit operatively associated with the equalize circuit with noise reducibility.

FIG. 34 shows an equalizer circuit E which includes a single CMOS transfer gate TG1 that is interposed between a sense line SN and reference sense line RSN. A timing control circuit 140 is used to generate, based on a reference timing signal EQLS, an equalize signal EQL for driving the NMOS transistor-side gate of CMOS transfer gate TG1 and an equalize signal EQLB used to drive its PMOS transistor-side gate in the absence of any timing difference therebetween.

The timing control circuit 140 has a pair of CMOS transfer gates TG2, TG3 for generating the equalize signal EQL and a pair of CMOS transfer gates TG4, TG5 for generating the equalize signal EQLB. The one pair of transfer gates TG2, TG3 have one-side ends which are connected to power supply voltage Vcc and ground potential Vss respectively and the other ends that are commonly connected together to a terminal N1. This terminal N1 is for use an a circuit node which outputs the equalize signal EQL through an inverter buffer INV1. The remaining pair of transfer gates TG4, TG5 have one-side ends coupled to ground potential Vss and supply voltage Vcc respectively and the other ends common-coupled to a terminal N2. This terminal N2 acts am an output terminal of the equalize signal EQLB via an inverter buffer INV2.

NMOS translators of the transfer gates TG2, TG4 and PMOS transistors of the transfer gates TG3, TG5 have their gates which are driven by a signal EQLSB as obtainable through inversion of a reference timing signal EQLS by an inverter INV11. PMOS transistors of the transfer gates TG2, TG4 and NMOS transistors of transfer gates TG3, TG5 have gates driven by a signal EQLSBB obtainable by further inverting the signal EQLSB by an inverter INV12. Outputs of the inverters INV1, INV2 become the equalize signals EQL, EQLB used to drive the gates of NMOS transistor and PMOS transistor of the transfer gate TG1, respectively.

Figure 35:
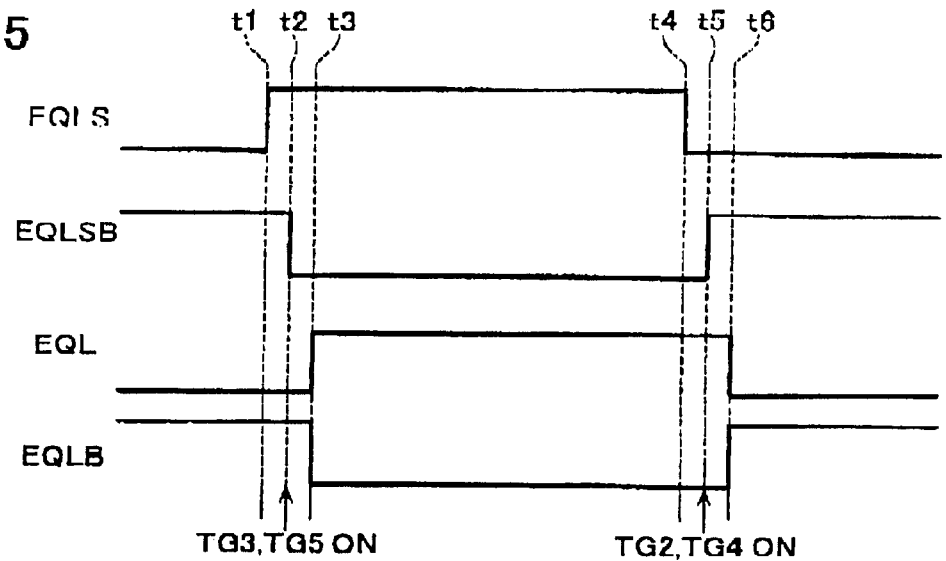
FIG. 35 is a diagram for explanation of an equalize operation by the timing controller circuit of FIG. 34.

Using the timing control circuit 140 arranged in this way makes it possible to obtain from the reference timing signal EQLS the intended equalize signals EQL, EOLB which complementarily become "H," "L" while having the same logic gate stage number. One exemplary signal generation pattern is shown in FIG. 35. When the reference timing signal EQLS potentially rises up (at time point t1), the signal EQLSB becomes at "L" level with a slight delay therefrom (at time t2). Whereby, the transfer gates TG2, TG4 turn on from off; instead, the transfer gates TG3, TG5 turn on simultaneously.

At this time, in the transfer gates TG3, TG5, although turn-on timings of PMOS and NMOS transistors exhibit appreciable deviation or "offset," when the PMOS transistor turns on, voltages Vss, Vcc are supplied to input nodes N1, N2 of the inverters INV1, INV2 respectively, thereby causing the equalize signal EQL="H" and EQLB="L" simultaneously (at time t3). In other words this timing control circuit 140 is such that there is no difference in gate stage number between a time period spanning from a rising edge of the reference timing signal EQLS to that of equalize signal EQL and a period of from the rising edge of signal EQLS to a falling edge of equalize signal EQLB.

The same goes with the event that the equalize signal EQL potentially transits from "H" to "L" level. The reference timing signal EQLS becomes "L" (at time t4); with a slight delay therefrom, the transfer gates TG2, TG4 turn on simultaneously (at time t5). Whereby, voltages Vcc, Vss are supplied to the input nodes of inverters INV1, INV2 to thereby establish EQL="H" and EQLB="L" (time t6). At this time also, there is no timing difference.

With such an arrangement, timing offset-free equalize signals EQL, EQLB are given to the transfer gate TG1 of equalize circuit E so that any unwanted switching noise injection into the sense line SN and reference sense line RSN will no longer happen in any way.

It should be noted that in case the transfer gates TG2 to TG5 are sufficiently large in current driving ability or "drivability," the inverters INV1, INV2 may be omitted causing the nodes N1, N2 to be directly used as the output terminals of equalize signals EQL, EQLB.

Figure 36:
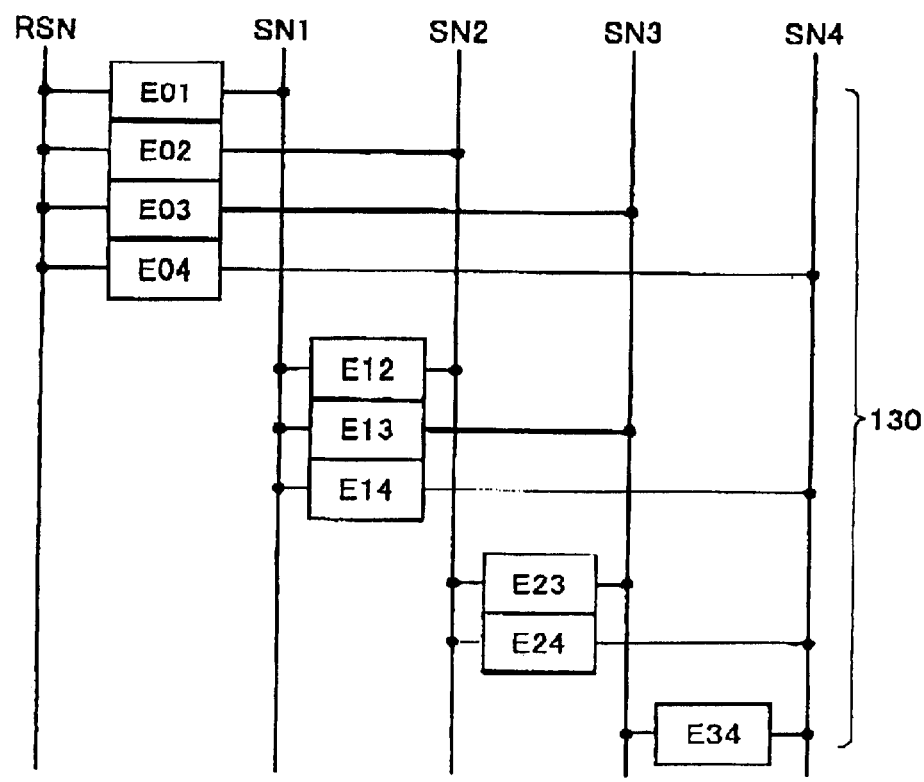
FIG. 36 is a diagram showing another configuration example of the equalize circuit.

FIG. 36 shows a configuration of further another equalizer circuit group 130. This equalizer circuitry 130 is specifically arranged so that a plurality of equalize circuits which are connected to a single reference sense line RSN and multiple sense lines SN sharing this line are the same in number. More specifically, while the case or four sense lines SN in shown in FIG. 36 for illustration purposes only, equalize circuits E01–E04 are provided between the reference sense line RSN and respective sense lines SN1 to SN4 in addition, equalize circuits E12, E13, E14 are provided between one sense line SN1 and the remaining all sense lines SN2–SN4. Likewise, equalize circuits E23, E24 are provided between sense line SN2 and sense lines SN3, SN4; an equalize circuit E34 is provided between sense line SN3 and sense line SN4.

In this way, when identically the same number (four in the illustrative example) of equalize circuits are connected to the reference sense line RSN and any one of respective sense lines SN1–4, switching noises being injected into the reference sense line RSN and each sense line SN upon interruption or removal of equalization become the same in magnitude in the event that this equalize circuit group 130 is under simultaneous turn-on/off control. Accordingly, even when using prior known equalize circuit configuration for this equalize circuit group 130, any sense operation delay due to switching noises hardly occur.

Any one of the above-stated equalize circuits based on MOS transistor pairs or alternatively CMOS transfer gate pairs is such that one end is connected to a sense line SN, whereas the other end is coupled to the reference sense line RSN. Recall here that an equalize circuit is the one that sets the sense line SN and reference sense line RSN at the same potential level to thereby simultaneously set a data line DL as connected to the sense line SN and a reference data line RDL being coupled to the reference sense line RSN also at the same potential. In view of this, it is possible to modify or alter the layout position in such a way as to connect the equalize circuit between each data line DL and the reference data line RDL.

[Reference Voltage Generator Circuit]

While a basic configuration of the reference voltage generator circuit 120 is shown in each of the sense amplifier circuits of FIGS. 13–14 and 22–25, this reference voltage generator circuit 120 is modifiable into a variety of forms when reduction to practice. Some examples thereof will be explained below.

Figure 40:
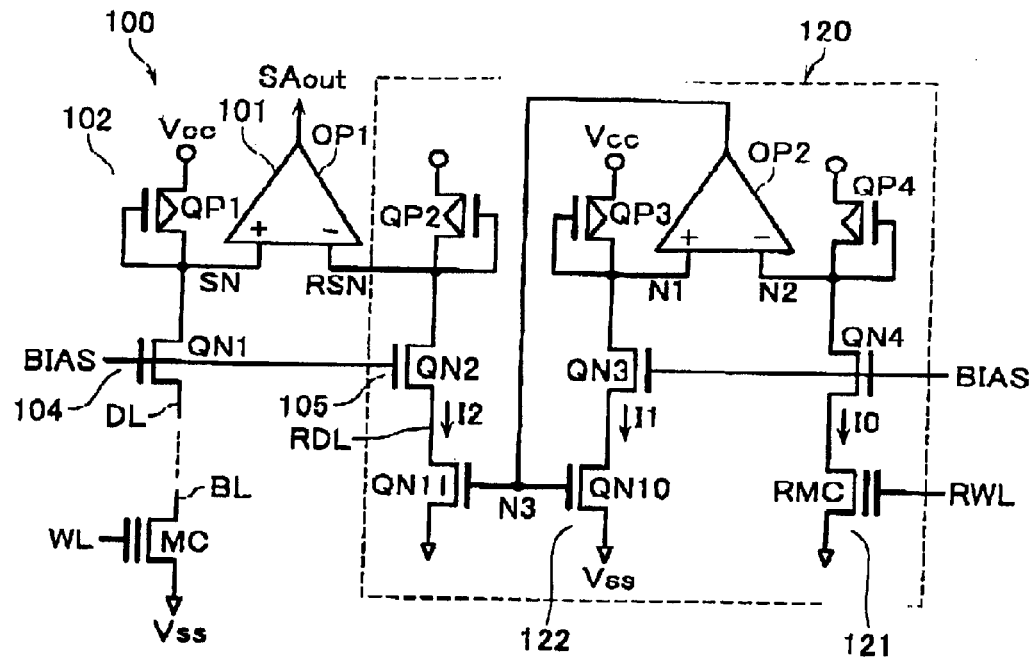
FIG. 40 is a diagram showing an exemplary configuration of a reference voltage generation circuit.

In FIG. 40, a reference voltage generator circuit 120 which is connected to the reference sense line RSN is arranged to transfer the reference current of a reference cell RMC toward a current source NMOS transistor QN11 for generation of a reference voltage. The current source NMOS transistor QN11 is connected to the reference sense line RSN through an NMOS transistor QN2 which constitutes a separator circuit in the same way as the memory cell MC side. A diode-coupled PMOS transistor QP2 for use as a current source load is connected to the reference sense line RSN.

Suppose that the reference cell RMC in formed by the same fabrication process to have the same structure as the memory cell MC. Note however that reference cell RMC is formed in a separate region different from the cell array region of memory cell MC. Also note that reference call RMC has write/erase functionality although details are not specifically shown herein. Whereby, it becomes possible to achieve successful threshold voltage adjustment based on product deliver/shipment test results even where reference cell RMC varies in threshold voltage during manufacturing processes.

The reference cell RMC has its drain which is connected to one input node (inverting input terminal) of an operational amplifier OP2 through an NMOS transistor QN4 making up a separator circuit in the same way as the sense amp 100 side. This node N2 is associated with a diode-coupled current source load PMOS transistor QP4 as connected thereto. A current flow path including this reference cell RMC constitutes a reference cell unit 121.

For this reference cell unit 121, a reference transistor unit 122 is arranged which includes a referencing NMOS transistor QN10 and which is a current pathway for permitting flow of a current I1 reflecting a current I0 at the reference cell unit 121. The gate of reference transistor QN10 and the gate of current source NMOS transistor QN11 are connected together to a common node N3. NMOS transistor QN10 has its drain connected through an NMOS translator QN3 that is a separator circuit to the other input node (non-inverting terminal) N1 of the op-amp OP2. Connected to the node N1 is a diode-coupled current source load PMOS transistor QP4. And, an output terminal of the opamp OP2 is connected to the node N3 so that the gate of reference transistor QN10 to under feedback control by an output signal of opamp OP2.

Additionally, the NMOS transistors QN3–QN4 making up the separator circuits in the reference cell unit 121 and reference transistor unit 122 are designed so that these are the same in size as the NMOS transistors QN1–QN2 forming the separator circuit on the sense amp 100 side and are applied the same gate bias voltage Vb as the latter.

At the opamp OP2 of this reference voltage generator circuit 120, its output potentially transits toward the high level side every time the potential of node N1 attempts to become higher than that of node N2. Whereby, negative feedback control is performed causing a current of the reference transistor QN10 to increase, which in turn forces a potential at node N1 to decrease. Thus the two nodes N1–N2 are hold at substantially the same potential level. Accordingly, by adequately setting the size ratio of, for example, the current source load PMOS transistors QP3–QP4 in the reference cell unit 121 and reference transistor unit 122, it is possible to cause the current I1 flowing in reference transistor unit 122 to have the significance of a prespecified ratio relative to the current I0 flowing in reference cell unit 121 in a similar way to the current-mirror circuit. In addition, since the reference transistor QN10 and the current source transistor QN11 being coupled to the reference sense line RSN substantially make up a current mirror, appropriate setup of the size ratio of them permits the current I2 flowing in current source transistor QN11 to have a predetermined ratio with respect to the current I1 flowing in reference transistor unit 122.

Practically the current I0 of the reference cell RMC is set equal to an on-cell's current Icell while letting the current I2 flowing in the current source NMOS transistor QN11 connected to the reference sense line RSN be set to I2=I0/2 one possible approach for doing this is as follows. Firstly, set the ratio of channel width W versus channel length L (referred to simply as "W/L ratio" hereinafter) of the current source load PMOS transistor QP3 of reference transistor unit 122 to half (½) of that of the current source load PMOS transistor QP4 of reference cell unit 121. With such ratio setting, I1=I0/2 is attained. On the other hand, let the reference transistor QN10 and current source transistor QN11 be the same in W/L ratio as each other. Whereby, a current of the current source transistor QN11 connected to the reference sense line RSN of sense amp 100 is given as I2=I1=I0/2=Icell/2.

Alternatively, let the load PMOS transistor QP4–QP3 of the reference cell unit 121 and reference transistor unit 122 be the same in W/L ratio as each other. In this case, I1=I0. And the W/L ratio of current source transistor QN11 be get to ½ of that of the reference transistor QN10. With such ratio setting, the current of the current source transistor QN11 connected to the reference sense line RSN of sense amp 100 becomes I2=I1/2=I0/2=Icell/2.

Still alternatively, by adjusting the size ratio of the NMOS transistors QN4–QN3 which are the separator circuits within the reference cell unit 121 and reference transistor unit 122 also, it is similarly possible to set the current I2 flowing in current source transistor QN11 at Icell/2.

As apparent from the foregoing, the reference voltage generator circuit 120 of FIG. 40 guarantees the flow of a constant current of the reference transistor QN10 by the negative feedback control scheme which controls the gate of reference transistor QN10 in response to an output of op-amp OP2 to thereby retain the nodes N1–N2 at the same potential level. As stated previously, in the prior art reference voltage generator circuit scheme using current-mirror circuitry, it is necessary to force the reference transistor within a reference transistor unit to perform a pentode operation in order to avoid the power supply dependency. This has been a serious bar to potentially lowering Vccmin (the minimum value of the supply voltage Vcc). In contrast, in the case of FIG. 40, the reference transistor QN10 is controlled by the op-amp OP2 to retain a constant current; thus, this transistor is free from the constraint of such pentode operability. This in turn makes it possible to achieve operating capabilities with an increased voltage range covering to lower Vccmin than the prior art. In other words, in case the sense amp 100 side is designed to uses direct sense schemes eliminating separator circuits in deference to the quest for lower power supply voltages, the lower supply voltage architecture is no longer limited by the reference voltage generator circuit.

Figure 41:
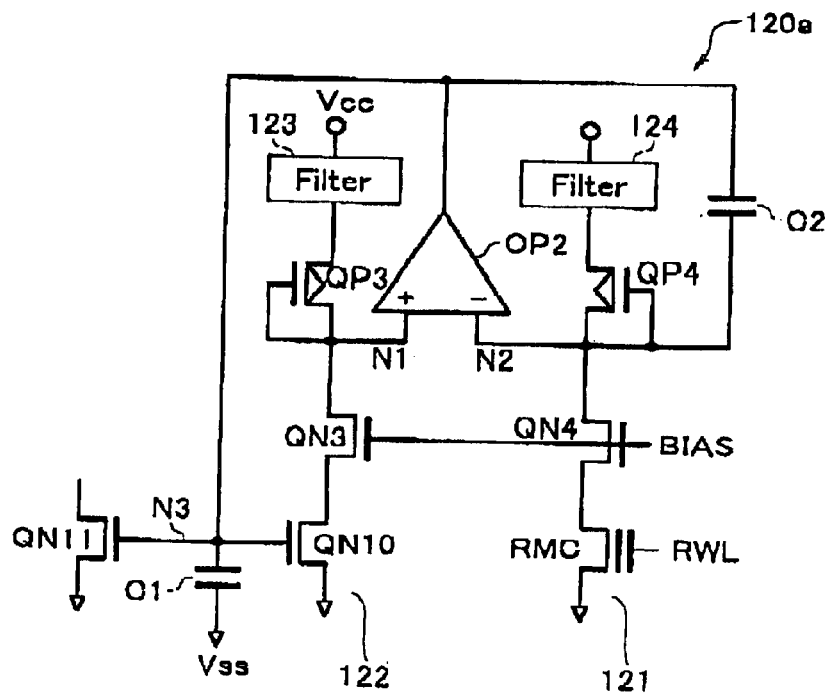
FIG. 41 is a diagram showing another exemplary configuration of the reference voltage generator circuit.

FIG. 41 shows a configuration of a reference voltage generator circuit 120a, which is formed by adding oscillation prevention means to the reference voltage generator circuit 120 of FIG. 40. A stabilizer capacitor C2 is connected between the output terminal and input node N2 of operational amplifier OP2, for preventing positive feedback operations. Note here that the common gate node N3 of referencing transistor. QN10 and current source transistor QN11 is readily encountered with unwanted application of noises due to rapid charge-up and discharging or else of the reference sense line RSN. In view of this, let a capacitor C1 be connected also to the node N3 for enabling reduction of noise influenceability. Further, filters 123, 124 are inserted between the PMOS transistors QP3, QP4 acting as the current source loads and the power supply terminals, thus enabling suppression of power noise influenceability.

Figure 42:
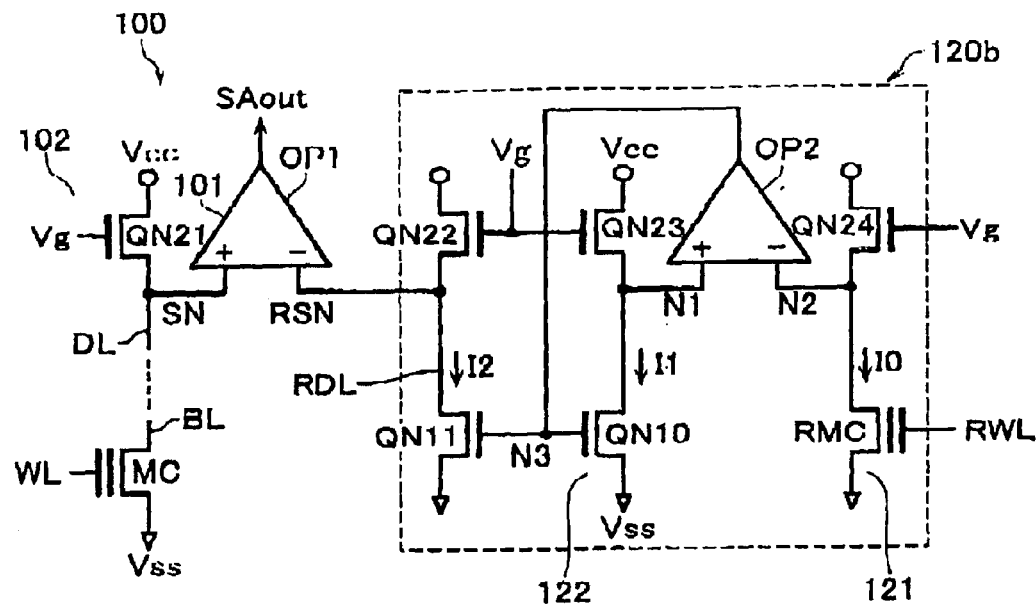
FIG. 42 is a diagram showing a configuration of a direct-coupled sense amp circuit and its associative reference voltage generator circuit.

FIG. 42 depicts an exemplary configuration of circuitry including a sense amplifier 100 and a reference voltage generator circuit 120b, wherein the sense amp 100 is of the type using a bit-line direct sensing scheme. Parts or components corresponding to those of the circuit of FIG. 40 are designated by the same reference characters, and any detailed explanations thereof will be omitted. The sense amp 100 has no separator circuits, causing the sense line SN to be directly connected to its associative bit line BL merely through a data line DL while letting the reference sense line RSN be directly connected to reference data line RDL. Note however that in order to suppress potential increase of the sense line SN and reference sense line RSN, the current source loads connected thereto are formed of NMOS transistors QN21, QN22 having gates which are driven by a prespecified bias voltage Vg. More specifically, any possible potential rise-up of the sense line SN and reference sense line RSN is limited to Vg-Vtn, where Vtn is the threshold voltage of NMOS transistor QN21, QN22. This permits these NMOS transistors QN21-QN22 to have clamping functionalities for suppression of bitline potentials.

In a way corresponding to employment of such sense amplifier 100 of the type using the bitline direct sense scheme, the reference voltage generator circuit 120b is similarly designed to eliminate the use of separator circuits and arranged so that the input nodes N1-N2 of operational amplifier OP2 are directly coupled to the drains of reference NMOS transistor QN10 and reference cell RMC respectively. In addition, the current source loads of reference transistor unit 121 and reference cell unit 122 to be formed at these nodes N1-N2 also are configured from NMOS transistors QN23-QN24 having gates to which the bias voltage Vg is given in a way similar to sense amp 31.

The circuit shown in FIG. 42 is similar to that of FIG. 40 in that the gate of reference NMOS transistor QN10 is feedback-controlled by an output of the op-amp OP2 in such a way as to hold nodes N1, N2 at the same potential level.

In the case of the FIG. 42 circuit also, it is possible to get the current I2 flowing in current source transistor QN11 to ½ of the on-cell current Icell by means of appropriate design of element sizes within the reference voltage generator circuit 120b by fabricating the reference cell RMC and memory cell MC using the same process to have the same structure to ensure that the same current Icell as the on-cell current flows therein. An example is that the W/L ratio of the current source NMOS transistor QN23 is set to ½ of that of the current source NMOS transistor QN24. With such setup, it is possible to let the current I1 of reference transistor unit 122 be ½ the current I0 of reference cell unit 121. At the time the current I2 flowing in current source NMOS transistor QN11 becomes equal to I2=I1=I0/2=Icell/2 while assuming that the reference transistor QN10 and current source transistor QN11 are the same in size as each other.

Alternatively, let the W/L ratio of current source NMOS transistor QN23 be the same as that of current source NMOS transistor QN24 while letting the W/L ratio of current source NMOS transistor QN11 be ½ of that of reference NMOS transistor QN10. Whereby, the current I2 that flows in current source NMOS transistor ON11 becomes equal to I2=I1/2=I0/2=Icell/2.

The use of such bitline direct sense scheme in this way permits the sense amp 100 to decrease in Vccmin. Moreover, by letting the reference voltage generator circuit 120b be the same in type as the sense amp 100 and also by feedback-controlling the gate of reference NMOS transistor QN10 using a control amplifier, it becomes possible for the reference voltage generator circuit 120b also to operate within an increased range covering to small Vccmin au in the sense amp 100.

Additionally, although the NMOS transistor QN21 to QN24 for use as current source loads also have clamp functions for suppression of unwanted bitline potential riseup as stated previously, it becomes possible, in case the power supply voltage is lowered in potential, to provide operating capabilities within an expanded voltage range covering to lower power supply voltages by using certain transistors which are lower in threshold voltage than the reference transistor QN10 and current source transistor QN11—for example, those with a threshold voltage of zero volts. In this case, such low threshold voltage transistors may be fabricated by using a mask for the other NMOS transistors during a process for performing channel ion doping or implantation to thereby eliminate execution of ion implantation.

Figure 43:
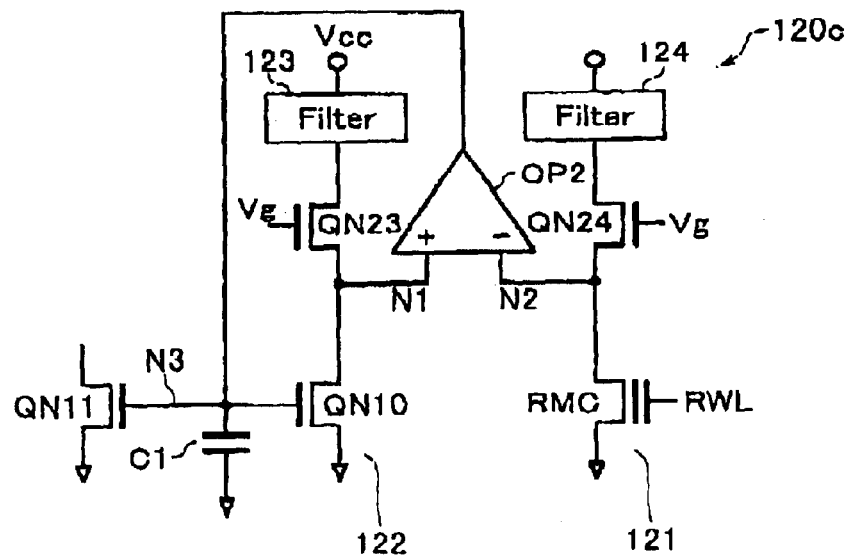
FIG. 43 is a diagram showing another configuration example of the reference voltage generator circuit.

FIG. 43 shows a configuration of a reference voltage generator circuit 120c. which is formed by adding oscillation prevention means to the reference voltage generator circuit 120b of FIG. 42. A stabilizer capacitor C1 is connected to the common gate node N3 of reference transistor QN10 and current source transistor QN11. Additionally filters 123, 124 are inserted between the current source load NMOS transistors QN23, QN24 and power supply terminals. Thus it becomes possible to attain well stabilized operability with reduced noise influenceability.

Figure 44:
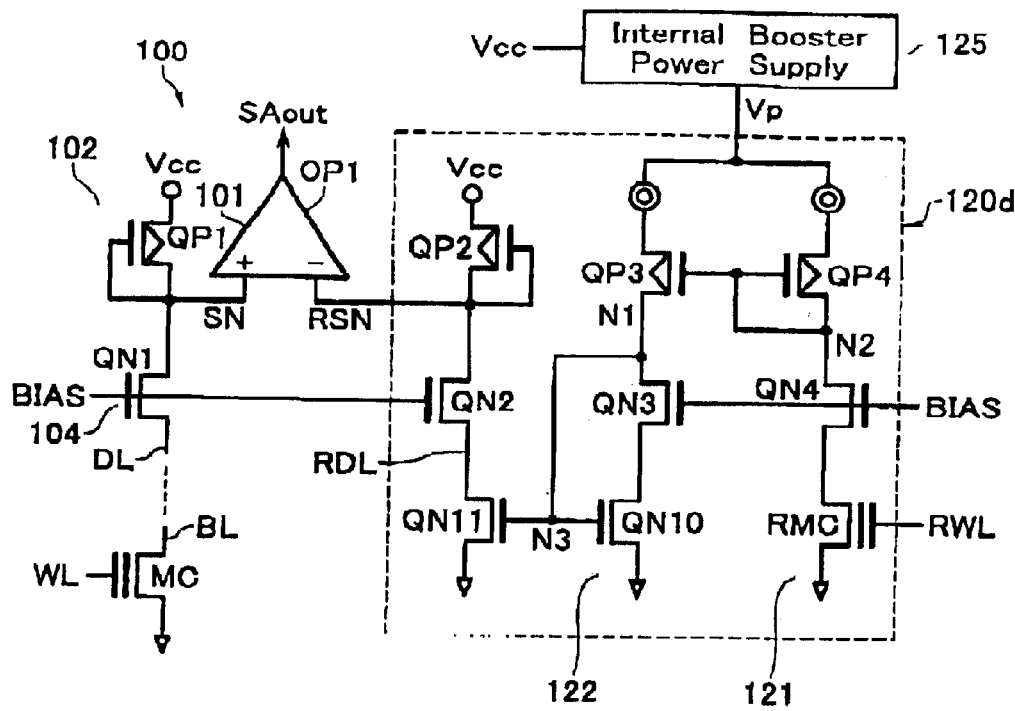
FIG. 44 is a diagram showing another configuration example of the reference voltage generator circuit.

FIG. 44 shows a configuration of further another circuitry including a sense amplifier 100 and a reference voltage generator circuit 120d. This sense amp 100 is the same in arrangement as that of FIG. 40. The reference voltage generator circuit 120d is principally similar in configuration to the prior art scheme. More specifically the current source load PMOS transistor QP3-QP4 of reference cell unit 121 and reference transistor unit 122 make up a current-mirror circuit. Note that the power supply voltage to be given to the sources of current source load PMOS transistors QP3-QP4 is not Vcc but an internal boosted voltage Vp which is potentially railed from Vcc by an internal boost power supply 125.

Preferably the current source load PMOS transistors QP3-QP34 to which the internal boosted power supply voltage is applied arc formed of high breakdown voltage transistors which are different from Vcc-based translators in well layer structure and in junction structure and also in gate oxide film thickness or else. When using the internal boosted supply voltage for the reference voltage generator circuit 120d in this way, the requirement for the reference NMOS transistor QN10 to have to perform a pentode operation does not become the reason why the reference voltage generator circuit is incapable of lowering Vccmin when compared to the sense amplifier. Accordingly. Vccmin in no longer determined by the reference voltage generator circuit so that the circuitry is capable of operating with an expanded voltage range covering to lower Vccmin.

Figure 45:
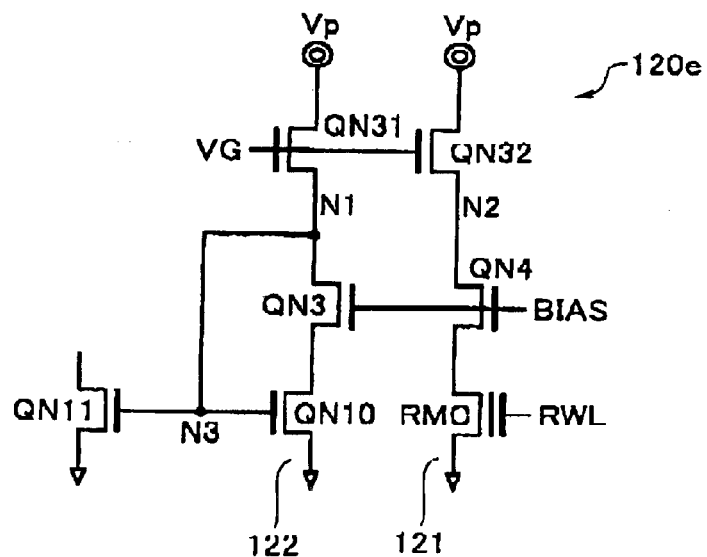
FIG. 45 is a diagram showing another configuration example of the reference voltage generator circuit.

FIG. 45 shows a reference voltage generator circuit 120e which is a modified version of the reference voltage generator circuit 120d of FIG. 44. Here, NMOS transistors QN31, QN32 are used an the current source loads, which transistors have gates with a predetermined bias VG is applied thereto. These NMOS transistors QN31–QN32 also are high-voltage transistors since the boosted supply voltage Vp is given thereto. Appropriately choosing the gate bias VG allows the voltages of nodes N1–N2 to become equal to VG-Vth (Vth it the threshold voltage of NMOS transistor QN31–32). This in turn makes it possible to prevent unwanted application of high voltages to separator circuit transistors QN3–QN4 and the following component.

Figure 46:
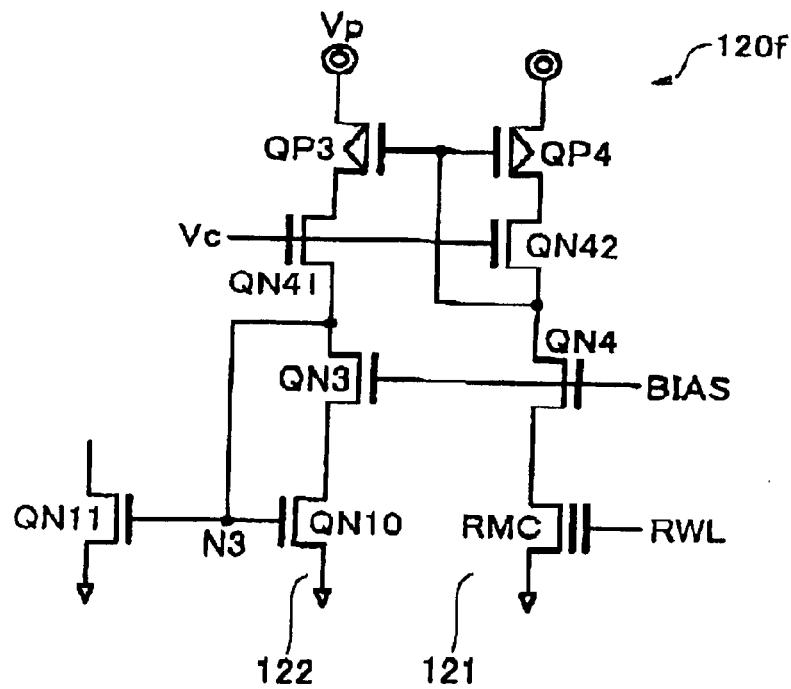
FIG. 46 is a diagram showing another configuration example of the reference voltage generator circuit.

FIG. 46 shows a reference voltage generator circuit 120f, which in aimed at preclusion of high voltage application to separator circuits and the following ones by modifying the reference voltage generator circuit 120d of FIG. 44. Clamping NMOS transistor QN41, QN42 are further inserted between the current source load PMOS transistors QP3, QP4 and separator circuit transistors QN3, QN4. By giving a prespecified bias voltage Vc to the gates of these clamp NMOS transistors QN41–QN42, unwanted high voltage transfer to the separator circuits and the following ones is prevented.

Figure 47:
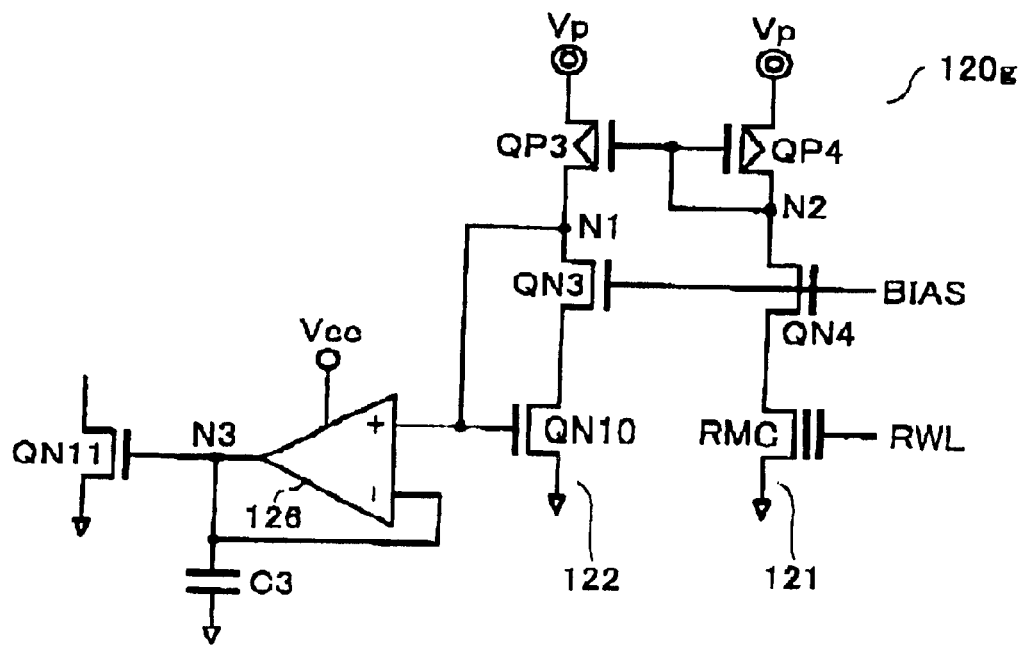
FIG. 47 is a diagram showing another configuration example of the reference voltage generator circuit.

A gate node N3 of the current source NMOS transistor QN11 has a relatively large capacitance. Due to this, a large current flows at the time of setup. Thus, in the case of using the internal boost power supply 125 as in FIG. 44, a decrease in internally boosted power supply voltage Vp can cause problems because of the incapability to freely enhance the current drivability of internal boost power supply 125. FIG. 47 shows a reference voltage generator circuit 120g which is a modified version of the reference voltage generator circuit 120d in FIG. 44 in view of this point. A buffer 126 of the voltage follower type is inserted between the node N1 and the gate of reference transistor QN10 on one hand and the gate of current source transistor QN11 on the other hand. This buffer 126 is to be driven by power supply voltage Vcc. With such an arrangement, it is possible to suppress or minimize any unwanted potential decrease of the internal boosted supply voltage Vp.

[Road Pulse Generator Circuit]

Figure 48:
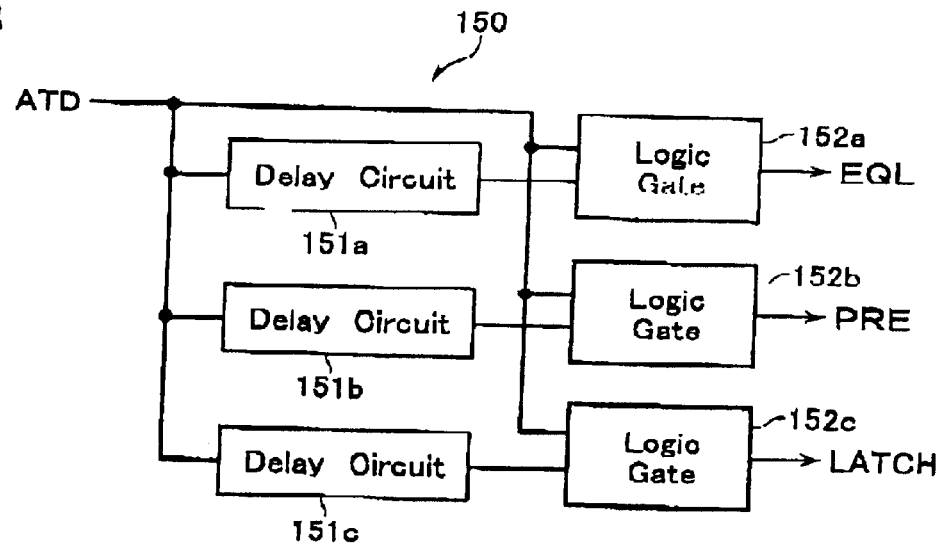
FIG. 48 is a diagram showing a configuration of a read pulse generating circuit in the read circuit.

The read pulse generator circuit 151 within the readout circuit 12 shown in FIG. 10 is principally arranged, as shown in FIG. 48, to include delay circuits 151a to 151c for delaying ATD pulse and logic gates 152a–152c for performing logical processing of outputs of these delay circuits and the ATD pulse to thereby obtain signals EQL, PRE, LATCH each having a pulse width determinable by the delay time of its corresponding delay circuit. The delay circuits 151a–151c are each configurable from a serial combination or "chain" of inverters.

Figure 50:
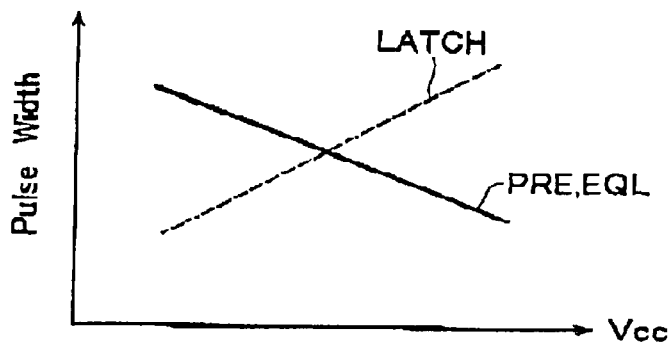
FIG. 50 is a diagram graphically showing the power supply voltage dependency of the pulse width of a pulse signal as output from the read pulse generator circuit.

However, in view of respective roles of pulse signals to be generated from the read pulse generator circuit 150, the delay circuits 151a–151c are preferably fabricated discretely. This point will be explained in detail below. Precharge and equalize transistors being driven by the precharge signal PRE and equalize signal EQL respectively are such that the higher the power supply voltage Vcc (higher Vcc), the higher the ability. Thus, the precharge signal PRE and equalize signal EQL may be designed so that the higher the supply voltage Vcc, the shorter the pulse width as shown in FIG. 50.

On the other hand, as for the latch signal LATCH, its signal pulse width depends upon the level transition of a data line and/or the transition time of an operational amplifier or else of a sense amplifier because the time taken for cell data judgment is determined after a precharge and/or equalize operation(s). In the case of higher Vcc, an op-amp and/or an inverter which receives its output can vary in circuit threshold voltage due to such high Vcc in spite of the fact that a potential different to be input to the opamp may be kept constant without regard to Vcc, resulting in necessity for an increased length of sense time period. Consequently it to preferable that the latch signal LATCH be designed so that its pulse width becomes longer with a potential increase in Vcc as shown in FIG. 50.

Figure 49A:
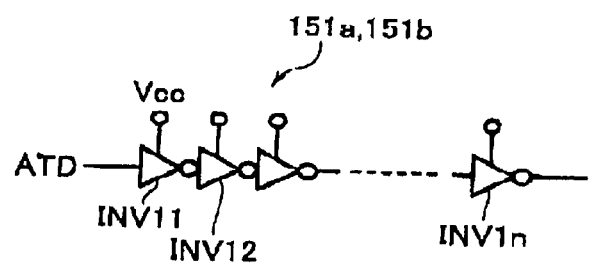
FIGS. 49A–49B are diagrams each showing a delay circuit configuration of the read pulse generator circuit.
Figure 49B:
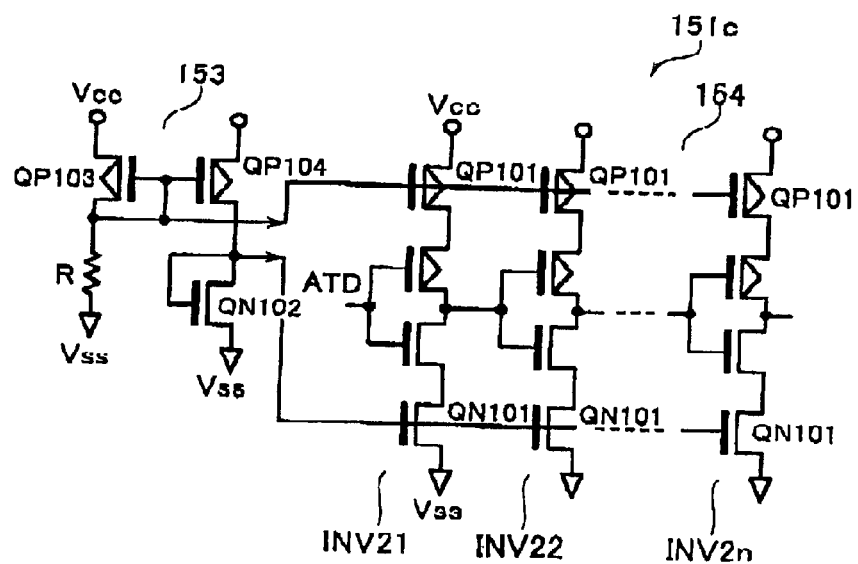

In light of the above points, the delay circuits 151a, 151b used for the precharge signal PRE and equalize signal EQL are each arranged by an inverter chain using standard inverters INV11, INV12, . . . as shown in FIG. 49A. In contrast, the delay circuit 151c for the latch signal LATCH is constituted from a constant current-driven inverter chain 154 as shown in FIG. 49B. More specifically. PMOS transistors QP101, QN101 for use as constant current sources are inserted into the power supply side and the ground side of each stage of inverter INV21, INV22, . . . , respectively. These are controlled by a reference current source circuit 153.

Concretely the reference current source circuit 153 is configured from a current-mirror circuit formed of PMOS transistors QP103–QP104, a resistor R connected to the drain of PMOS transistor QP103, and a diode-coupled NMOS transistor QN102 as connected to the drain of PMOS transistor QP104. The inverter chain 154's PMOS transistor QP101 makes up a current-mirror circuit together with the power supply side PMOS transistor QP103 of reference current source circuit 153. Similarly the ground side NMOS transistor QN101 makes up a current-mirror circuit together with the NMOS transistor QN102 of reference current source circuit 153.

With such an arrangement, a currant Ipch which is determined by the PMOS transistor QP103 regardless of the power supply voltage Vcc flown in the PMOS transistor QP101 of each inverter INV21, INV22, . . . , whereas a current inch which is determined by the NMOS transistor QN102 without regard to the supply voltage flows in NMOS transistor QN101. In this case, the delay time of delay circuit 151c is proportional to C·Vcc/I, where C is the input capacitance of inverter. Vcc is the supply voltage, and I is the current. Thus it is possible to obtain the required latch signal LATCH which increases in pulse width as Vcc becomes higher as shown in FIG. 50.

[Data Buffer]

The output circuit used in the data buffer 9 of FIG. 1 is for driving large load capacitance coupled to chip outside terminals and thus requires flow of a large current therein. Due to this, when outputting data, noises can take place due to a significant current change di/dt, which can affect the intrachip circuitry.

Figure 51:
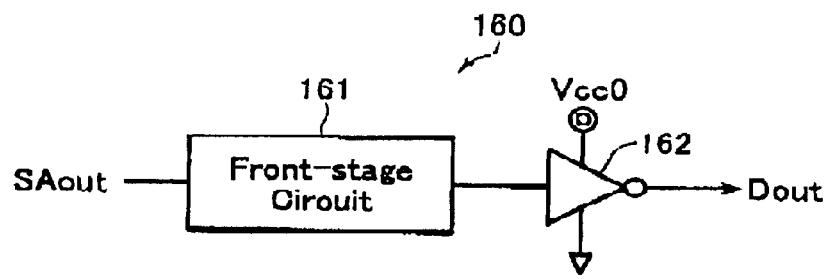
FIG. 51 is a diagram showing a configuration example of an output circuit in the date buffer of FIG. 1.

FIG. 51 shows an exemplary configuration of an output circuit 160 which is effective for noise reduction. This data output circuit 160 has an output buffer 162 and a front stage or "pre-stage" control circuit 161 which is inserted at a stage in front of output buffer 162. Controller 161 receives output data being transferred from the read circuit 12 of FIG. 1 and controls transition of it. One of effective means for noise reduction is to apply power supply voltages Vcc0, Vss0 to output buffer 162 via terminals independent of those of the intrachip supply voltages Vcc. Vss as shown in FIG. 51. Whereby, it is possible to suppress voltage variation or fluctuation of power lines within the chip even when power supply voltage variation occurs due to rapid current changes at output buffer 162.

Another means for reducing di/dt noises at the time of data output is the pre-stage control circuit 161. This prestage controller 161 in operable to lessen gate voltage changes otherwise occurring when transistors QP153. QN153 of the output buffer 162 turn on to thereby suppress any possible shortcircuit current or "shoot-through" current flowable in output buffer 162.

Figure 52:
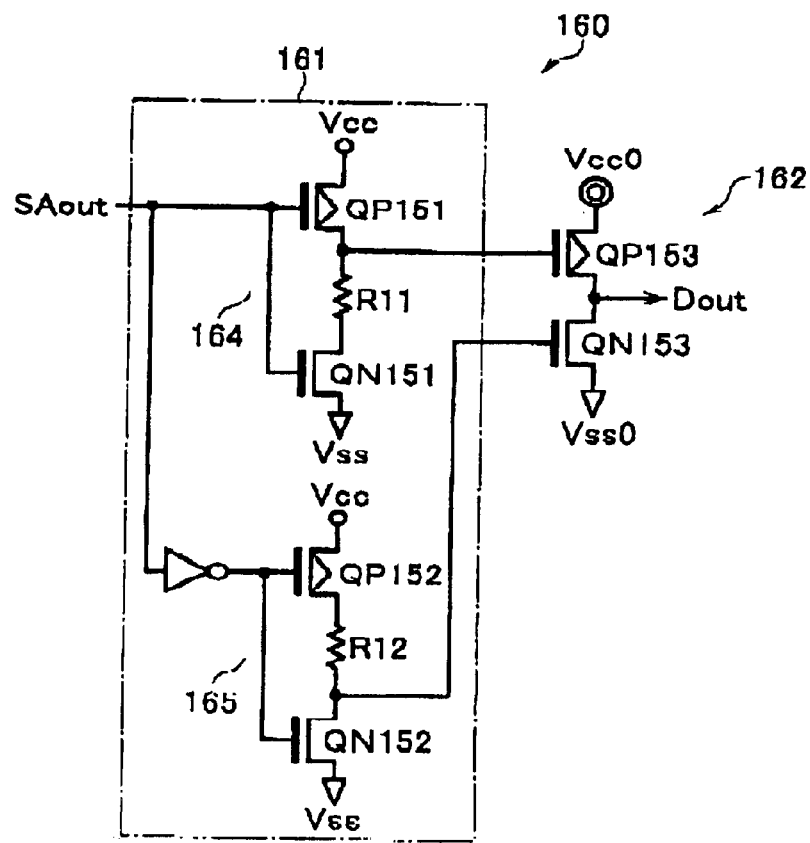
FIG. 52 is a diagram showing a detailed configuration of the output circuit.

FIG. 52 shows an example of the pre-stage control circuit 161. Separate drivers 164, 165 are prepared to drive the PMOS transistor QP153 and NMOS transistor QN153 of the output buffer 162 in responding to receipt of a sense output signal SAout. The driver 164 is an inverter formed of a PMOS transistor QP151 and an NMOS transistor QN151, with a resistor R11 inserted therebetween. Driver 164 is such that a connection node of the resistor R11 and PMOS transistor QP151 is for use as an output node, which in connected to the gate of PMOS transistor QP153 of output buffer 162. Likewise, the driver 165 is made up of a PMOS transistor QP152 and NMOS transistor QN152 with a resistor R12 inserted therebetween. Driver 165 is such that a connection node of resistor R12 and NMOS transistor QN152 acts as an output node, which is connected to the gate of NMOS transistor QN153 of output buffer 162.

The use of such drivers 164–165 makes it possible to lessen or relax gate voltage variability of PMOS transistor QP153 and NMOS transistor QN153 of output buffer 162 when these transistors turn on. More specifically, when the NMOS transistor QN151 of driver 164 turns on causing the output buffer 162's PMOS translator QP153 to turn on, the gate discharging speed of PMOS transistor QP153 is suppressed by the resistor R11. Alternatively, when the PMOS transistor QP152 of driver 165 turns on allowing the output buffer 162's NMOS translator QN153 to turn on, the gate chargeup speed of NMOS transistor QN153 is lowered by the resistor R12. With the above arrangements, any shoot-through current is suppressed at output buffer 162, thus enabling reduction of di/dt noises.

Figure 53:
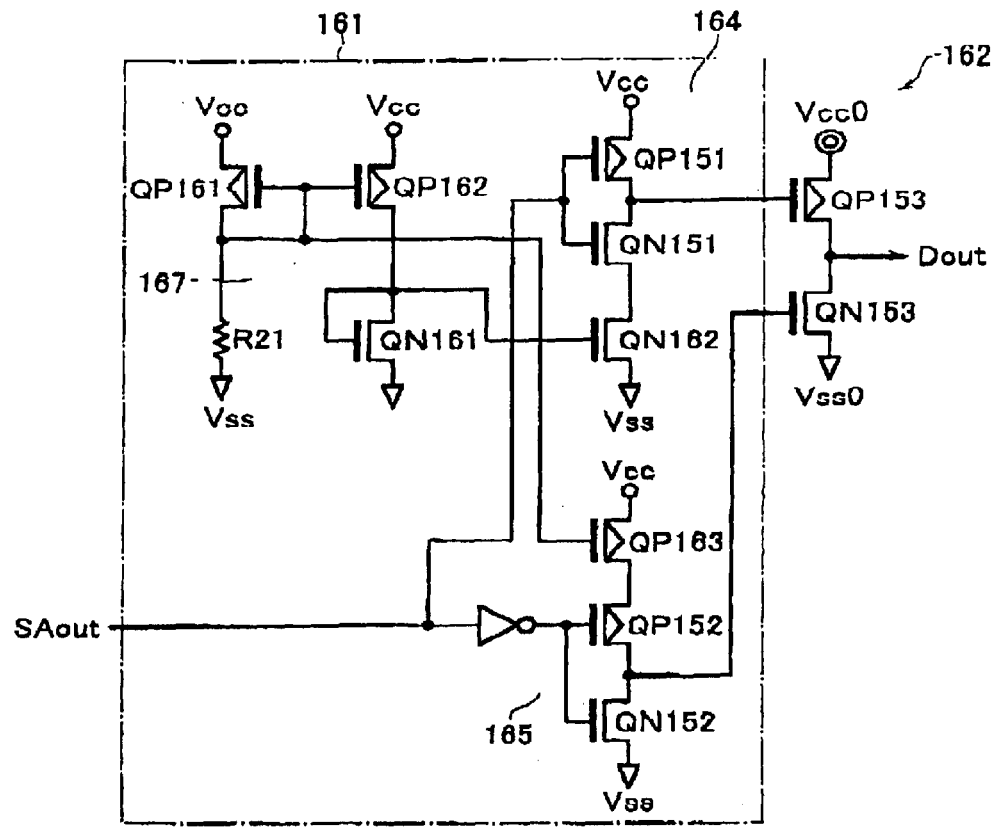
FIG. 53 is a diagram showing another detailed configuration of the output circuit.

FIG. 53 shows another example of the pre-stage control circuit 161. Although this example is the one that realizes similar functionality to the prestage control circuit 161 of FIG. 52, NMOS transistor QN162 and PMOS transistor QP163 are inserted as circuit elements equivalent to the resistors R11–R12 in the drivers 165–165 of FIG. 52. These NMOS transistor QN162 and PMOS transistor QP163 are driven to ensure that currents flowing when the outputs of drivers 164–165 change to "L" and "H" levels respectively are kept constant. To do this, a reference current source circuit 167 is provided.

The reference current source circuit 167 is constituted from a current-mirror circuit formed of PMOS transistors QP161–QP162, a resistor R21 connected to the drain of PMOS transistor QP161, and a diode-coupled NMOS transistor QN161 connected to the drain of PMOS transistor QP162. The PMOS transistor QP163 of driver 165 makes up a current-mirror together with the PMOS transistor QP161 of reference current source circuit 167; the driver 164's NMOS translator QN162 is connected to constitute a current-mirror together with the NMOS transistor QN161 of reference current source circuit 167.

With much an arrangement, in a similar way to that of the prestage control circuit of FIG. 52, when the output buffer 162's PMOS transistor QP153 and NMOS transistor QN153 turn on, their gate voltage change speed is slowed to suppress a penetration or shoot-through current at output buffer 162, thereby reducing di/dt noises.

Figure 54:
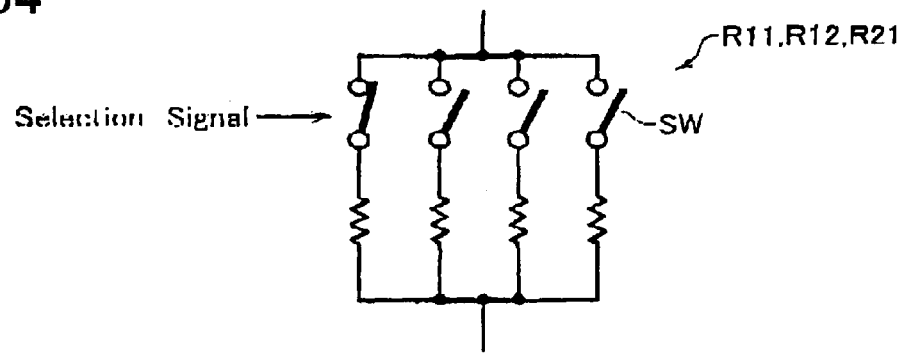
FIG. 54 is a diagram showing a resistance varying mechanism of the output circuit.

Preferably the resistors R11–R12 in FIG. 52 or the resistor R21 of FIG. 53 is designed to be variable in resistance value in response to a select signal. For example, as shown in FIG. 54, a plurality of parallel resistors are prepared so that any one of them is selectable by a switch SW. With such an arrangement, it is possible to select whether the chip of interest is designed as a flash memory with enhanced noise reducibility with little sacrificial decrease in high-speed performance or alternatively as a flash memory with top priority given to achievement of high-speed performance, in a way corresponding to the noise amount accepted in accordance with a system with such chip assembled therein. Practically the select signal for performing selection of the resistors of FIG. 54 is generated by a programmable non-volatile memory cell similar to that in the mode changer circuit 13 as stated previously in conjunction with FIG. 5. With this approach, it is possible to establish setup of optimal conditions at the time of chip product shipment.

[Charge Transfer Gate]

As previously stated, the sense amplifier circuit performs data sending after having potentially equalized between the data line DL and reference data line RDL. In this case, the turn-on/off timing of a column gate is different in accordance with the location or position of a cell block to be selected. This would result in occurrence of deviation in time to be consumed until the column gate of a nonselected cell block actually turns off after completion of equalization. And a large load capacitance is coupled to data line DL until the column gate turns off. Hence, data line DL behaves to potentially swing or "vibrate" in some cases.

In case logic data determination must be done at a time point during chargeup of the data line DL owing to a sense amplifier for high-speed readout purposes, the above-noted data line potential swinging or vibration makes the data determination difficult. And if it must wait for final settlement of a data-line potential in accordance with cell. data in order to make sure the data judgment, then this brings a delay in data readout.

Figure 55:
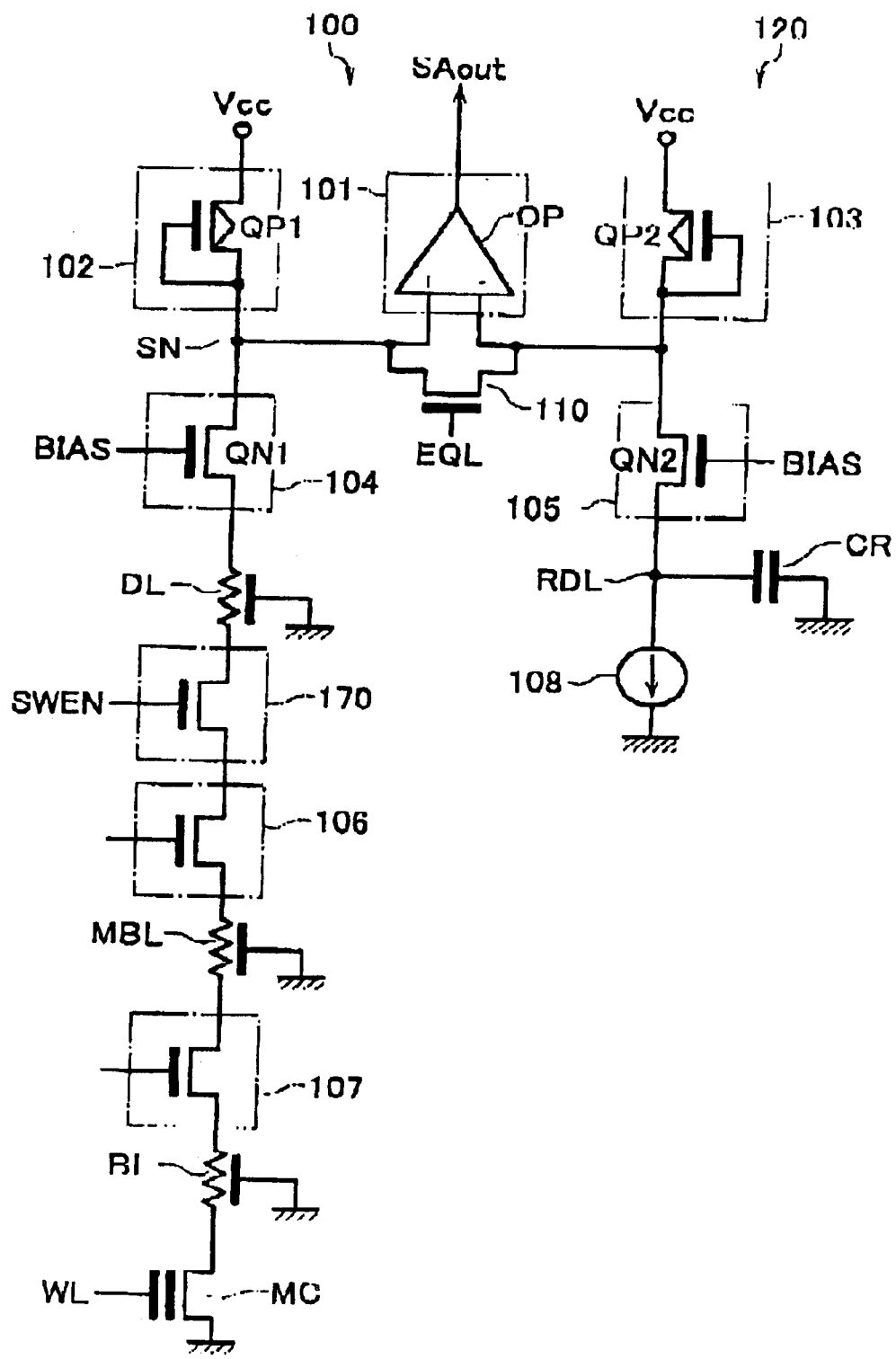
FIG. 55 is a diagram showing a sense amp scheme with a charge-up/transfer gate added thereto.

An effective approach to avoiding this is to dispose a charge transfer gate 170 between the data line DL and each cell block as shown in FIG. 55. Let this charge transfer gate 170 remain off to ensure that any large capacitance it not coupled to data line DL until cell-block selection is completed. More specifically the charge transfer gate 170 is the one that is added to multiple stages or column gates 106, 107 at a position nearest to the data line DL and has column gate functionality, and is arranged to turn on in response to receipt of a control signal SWEN while being synchronized with the timing whereat column gates 106–107 open. Thus the control signal SWEN is designed to be adjustable in timing in accordance with an address(es). By using such charge transfer gate 170 to control the exact timing of data-line chargeup owing to the sense amplifier, it is possible to suppress any unwanted potential swing or vibration of the data line DL at the time of data sense, resulting in high-speed readout being enabled.

[Redundancy]

Figure 56:
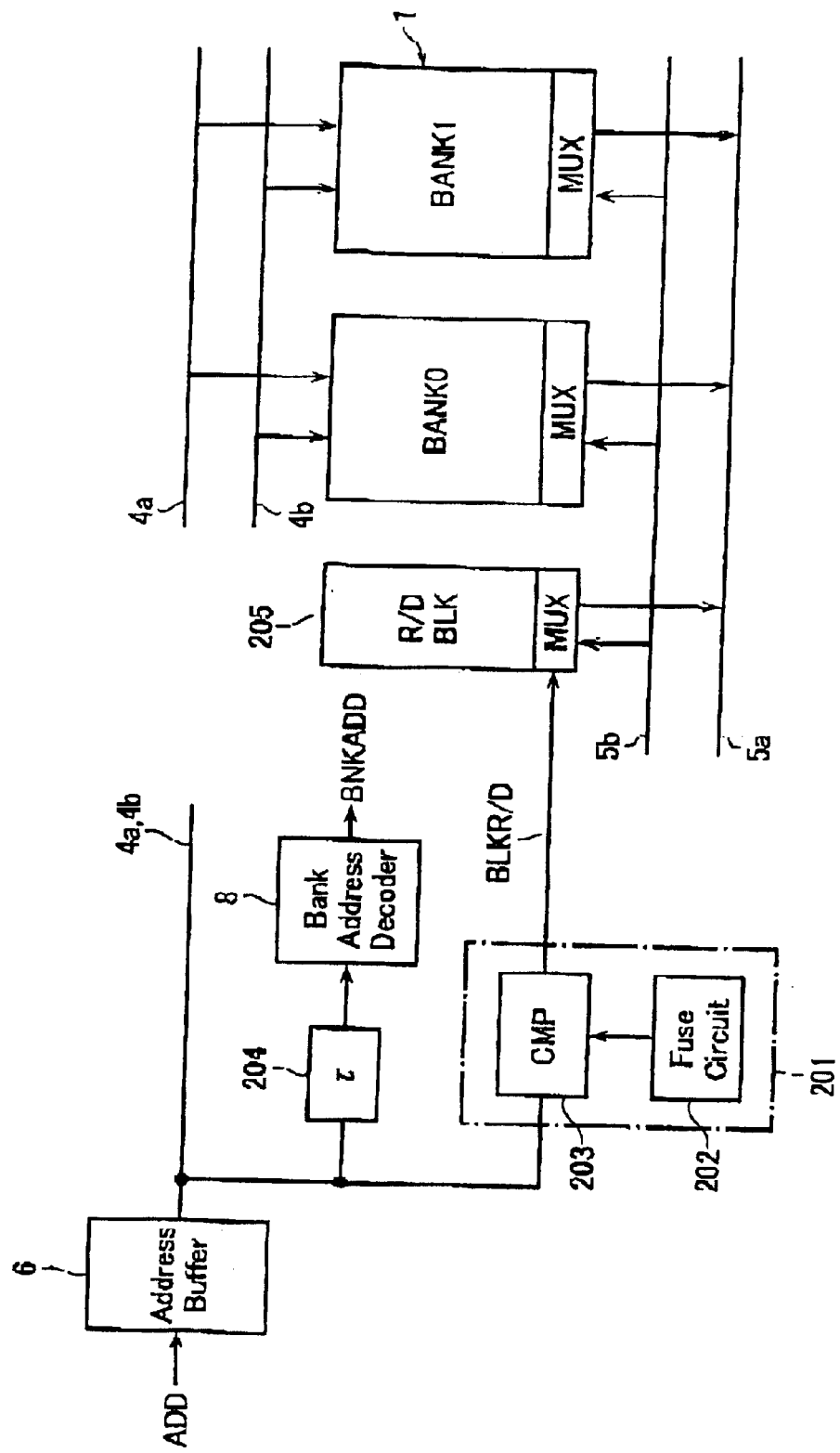
FIG. 56 is a diagram showing a circuit configuration used to avoid difficulties in address selection in the case of using a built-in redundancy system.

In flash memories, it is an ordinary technique to mount or embed a redundancy system for recovery or relief of defective cells in the memory cell array. In chips with this built-in redundancy system, address select timing adjustment in required in some cases. This will be explained in detail with reference to FIG. 56 below. In FIG. 56 an example is shown in which a memory cell array 1 has two banks BANK0, BANK1 each consisting essentially of a plurality of cell blocks and also has a redundancy cell block 205 for performing defective cell replacement in units of cell blocks. To perform such defect replacement, a redundancy block activation control circuit 201 is used, which is also known as redundancy block judgment circuit.

The Judgment circuit 201 includes a fuse circuit 202 which functions as a defect address storage circuit. More than one defective cell address is programmed into the fuse circuit 202 based on wafer teat results. An externally input address is compared by a comparator 203 with the fuse data (i.e. defect address) thus programmed in fuse circuit 202. Whenever coincidence is detected by comparator 203, a block replace signal BLKR/D is output. Using this block replace signal BLKR/D, replacing control to done for activating the redundancy cell block 205 in place of a detective cell block.

Figure 57:
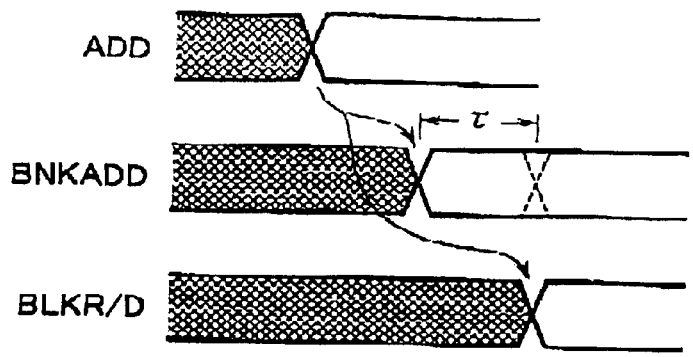
FIG. 57 is a diagram for explanation of address selection difficulties occurring when using the built-in redundancy system.

However, decision at the redundancy block judgment circuit 201 is often delayed and comes after completion of normal address selection. FIG. 57 shows the way that a bank select address BNKADD is output by the bank address decoder 8 of FIG. 1 upon receipt of an input address signal ADD and thereafter a block replace Signal BLKR/D is output with a significant delay therefrom. In this situation the delay of block replace signal BLKR/D would result in unintentional selection of a call block containing one or more defective cells, which block should not inherently be selected. This erroneous cell block selection causes access failure or alternatively accidental flow of a large shortcircuit current.

One effective means for avoiding this risk is to insert a delay circuit 204 into an address signal transmission path for bank address selection as shown in FIG. 56. Whereby, 1st the output timing of a bank select address BNKADD be delayed by t as indicated by broken lines in FIG. 57, thereby forcing it to match the output timing of block replace signal BLKR/D. Performing this timing control makes it possible to achieve defective block replacing control with increased reliability. Optionally the delay circuit 204 may be laid out on the output side of the bank address decoder 8.

Figure 58:
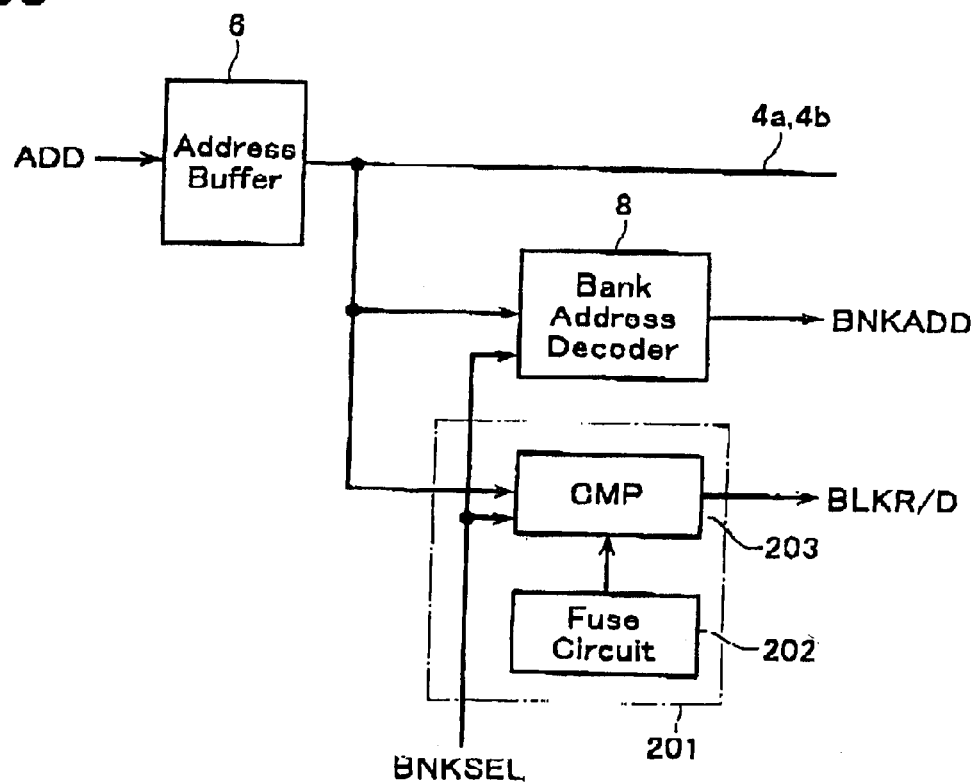
FIG. 58 is a diagram showing another circuit configuration usable to avoid address selection difficulties in case the built-in redundancy system is used.

Another available means for avoiding the above-noted inconvenience to allow the bank address decoder 8 and the comparator 203 of redundancy block judgment circuit 201 to operate in a synchronized way by use of a timing signal BNKSEL as shown in FIG. 58. Using such timing control also makes it possible to similarly achieve the defective block replacing control with enhanced reliability.

[Another Delay Circuit]

Figure 59:
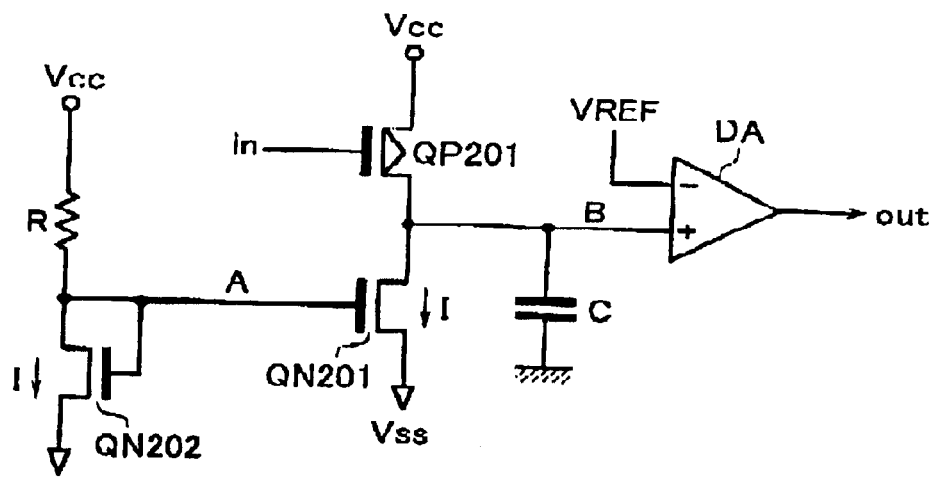
FIG. 59 is a diagram showing an exemplary configuration of another delay circuit.

While FIG. 49 shows one specific delay circuit configuration example for read pulse generation, another exemplary delay circuit with lose power supply dependency in shown in FIG. 59. This delay circuit is effectively applicable to timing circuitry which determines a time period spanning from data latch up to power-down, by way of example. A single current flow path is formed by a resistor R and a diode-coupled NMOS transistor QN202. A PMOS transistor QP201 being driven by an input signal in and an NMOS transistor QN201 are connected in series to form another current flow path. NMOS transistors QN201–QN202 have their gate nodes A which are commonly coupled together to thereby constitute a current-mirror. A connection node B of PMOS transistors QP201 and NMOS transistor QN201 is connected to the non-inverting input of a differential amplifier DA, Which has its inverting input to which a reference voltage VREF is applied. A capacitor C is connected to the node B.

Figure 60:
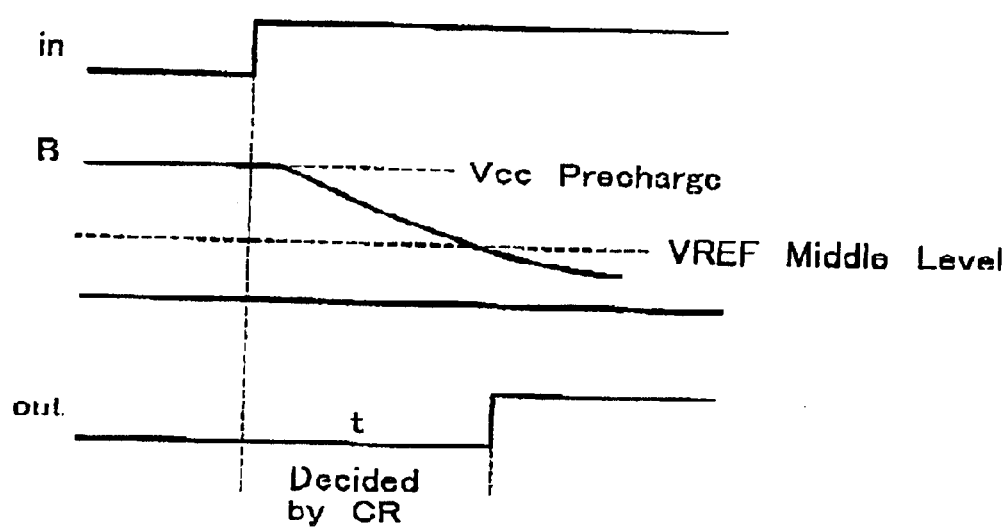
FIG. 60 is a diagram showing waveforms of some major signals generated during operation of the delay circuit.

FIG. 60 shows some major signals generated during operation of the delay circuit of FIG. 59. When the input signal in potentially rises up, the PMOS transistor QP201 turns off causing the electrical charge that has been accumulated or stored at the capacitor C to be discharged through the NMOS transistor QN201, which results in a decrease in voltage of the connection node B. When this node B's voltage drops down to the reference voltage VREF, an output signal out potentially goes high to reach "H" level.

At this time, the delay time t that spans from a rising edge of the input signal in up to a rising edge of output signal out is as follows. A current flowing in the resistor R is given as I=Vcc/R, if a potential drop at the NMOS transistor QN202 is ignored. Assuming that the NMOS transistors QN201–Q202 are the same in size as each other, a current flowing in NMOS transistor QN201 is also defined by I, thus, the connection node B's discharge time from its precharge potential Vcc is proportional to Vcc·C/I=Vcc·C/Vcc/R=CR. To be brief, the delay time t is the value determinable by the resistor R and capacitor C, without regard to the power supply voltage Vcc.

[Another Address Transition Detector Circuit]

Figure 61:
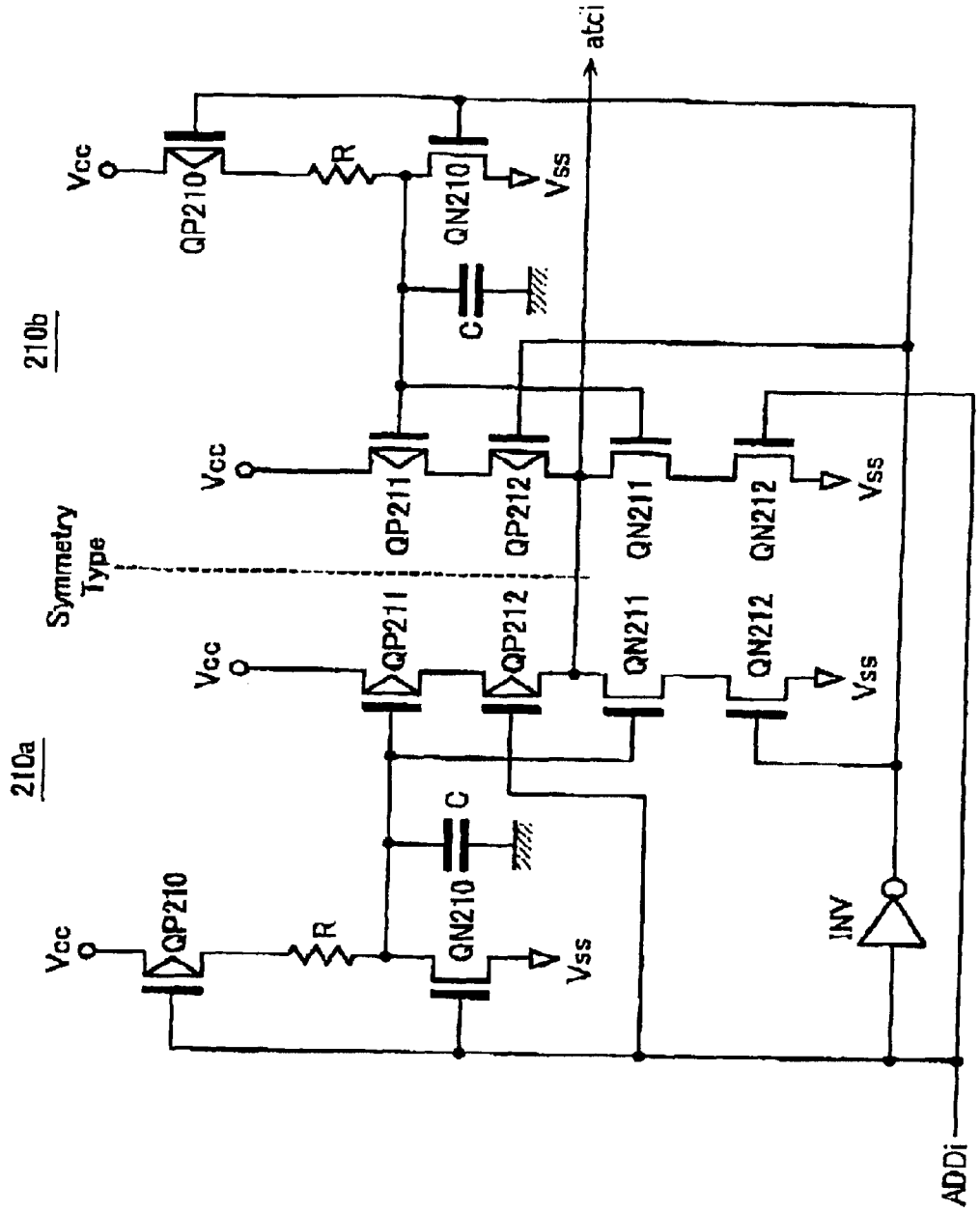
FIG. 61 is a diagram showing an exemplary configuration of another address transition detector circuit.

FIG. 61 shows a configuration of another address transition detector circuit. This circuit is configured from a parallel combination of two "symmetrical" pulse generation circuits 210a–210b. each of which uses a CR time constant circuit to generate an address transition detection pulse signal with a certain pulse width. Corresponding parts of these two pulse generator circuits 210a–b are denoted by the same reference characters.

An input stage for receipt of an address signal ADDi is principally constituted from an inverter which in formed of a PMOS transistor QP210 and an NMOS transistor QN210, with a resister R interposed therebetween and with a capacitor c connected to an output section. Accordingly, whenever the output transits to "H" level, a CR time constant-based delay is given. An output stage for receipt of such delay output includes a aerial combination of a PMOS transistor QP211 to which the delay output is input and an NMOS transistor QN211 and also includes a serial connection of a PMOS transistor OP212 and an NMOS transistor QN212, wherein the former receives an address signal ADDi and its inverted signal.

An address signal ADDi and its inverted version of signal are complementarily input to the two pulse generator circuits 210a–210b. Thus, address transition detection signals atd1 are generated at rising and falling edges of the address signal ADDi respectively, each of which signals has a pulse width determinable by the CR time constant. More precisely, when address signal ADDi potentially rises up, the right-side pulse generator circuit 210b is rendered operative to generate a pulse in the way which follows. First, upon receipt of potential riseup of the address signal ADDi, the NMOS transistor QN212 and PMOS transistor QP212 turn on. At this time the capacitor C's charge has already been discharged by the NMOS transistor QN210 so that PMOS transistor QP211 turns on and NMOS transistor QN211 turns off. Then, PMOS transistor QP210 at the input stage turns on, whereas NMOS transistor QN210 turns off. This permits startup of charging to the capacitor C through the resistor R. After elapse of a prespecified delay time, PMOS transistor QP211 turns off while NMOS transistor QN211 turns on.

In this way, the required address transition detection signal atd1 with a pulse width determinable by the CR time constant is obtained by the right side pulse generator circuit 210b when the address signal ADDi potentially rises up. Similarly when address signal ADDi drops down in potential, the intended address transition detection signal atd1 with a width determinable by the CR time constant also is generated by the left-side pulse generator circuit 210a.

It has been stated that according to this invention, it is possible to provide a nonvolatile semiconductor memory device with multiple read modes switchably built therein.

What is claimed is:

1. A nonvolatile semiconductor memory device comprising:
    a memory cell array with an array of electrically rewritable nonvolatile memory cells; and
    a read circuit for performing data readout of said memory cell array, wherein
    said device has a first read mode for reading data while performing parallel data transfer of an identical bit number when sending data from said memory cell array through said read circuit to more than one external terminal and a second read mode for performing parallel data transfer of a greater bit number than that of said first read mode when sending data from said memory cell array to said read circuit and for performing data transfer of a smaller bit number than the bit number when sending data from said read circuit to said external terminal.

2. The nonvolatile semiconductor memory device according to claim 1, further comprising:
    a mode changing circuit for changing between said first read mode and said second read mode.

3. The nonvolatile semiconductor memory device according to claim 2, further comprising an address buffer for taking an address signal thereinto, said address buffer including:
    an input buffer group for input of an address signal;
    an address transition detecting circuit for detecting a level transition of each output of this input buffer group to thereby detect an address transition; and
    a logic gate controlled by a change signal as output from said mode changing circuit for performing changing of outputs of said input buffer group being supplied to said address transition detecting circuit in accordance with said first read mode and said second read mode.

4. The nonvolatile semiconductor memory device according to claim 3, wherein said address transition detecting circuit is configured so that it detects any changes of the outputs from the input buffer group when the first read mode is performed, and detects the changes of the outputs from the input buffer group concerning upper-level addresses only when the second read mode is performed.

5. The nonvolatile semiconductor memory device according to claim 4, wherein said logic gate is configured to receive said change signal and outputs from said input buffers for inputting low-level address signals as input thereto and to output said low-level address signals in accordance with said change signal.

6. The nonvolatile semiconductor memory device according to claim 2, wherein said read circuit includes:
    a first sense amplifier array for detection of a plurality of cell data of said memory cell array in the first read mode, said first sense amplifier array being controlled in activation and inactivation by the change signal as output from said mode changing circuit;
    a second sense amplifier array for detection of a plurality of cell data of said memory cell array in the second read mode, said second sense amplifier array being controlled in activation and inactivation by the change signal as output from said mode changing circuit;
    a first switching circuit controlled by said change signal to selectively transfer read data from said memory cell array toward one of the first and second sense amplifier arrays, said first switching circuit having a decoding function in a transfer pathway leading to said first sense amplifier array; and
    a second switching circuit controlled by said change signal to selectively transfer an output of one of said first and second sense amplifier arrays toward said external terminal.

7. The nonvolatile semiconductor memory device according to claim 6, further comprising:
    a data latch circuit for temporal storage of each sense amplifier output of said first and second sense amplifier arrays.

8. The nonvolatile semiconductor memory device according to claim 6, wherein said first sense amplifier array is provided independently of said second sense amplifier array.

9. The nonvolatile semiconductor memory device according to claim 6, wherein said first sense amplifier array is provided as part of said second sense amplifier array.

10. The nonvolatile semiconductor memory device according to claim 9, wherein said first sense amplifier array is kept active constantly in any events irrespective of said change signal.

11. The nonvolatile semiconductor memory device according to claim 6, wherein each sense amplifier constituting said first and second sense amplifier array is configured to share a reference voltage generating circuit which provides reference voltage for data-sensing.

12. The nonvolatile semiconductor memory device according to claim 11, wherein said sense amplifiers have their sense lines to which a dummy sense-line capacitor are added.

13. The nonvolatile semiconductor memory device according to claim 2, wherein said mode changing circuit includes:
    an exclusive memory cell formed of an electrically rewritable nonvolatile memory cell;
    a write circuit for writing data into this exclusive memory cell; and
    a read circuit for reading write data of said exclusive memory cell as said change signal and for storing the data therein.

* * * * *